United States Patent
Tao et al.

(10) Patent No.: US 12,281,006 B2
(45) Date of Patent: Apr. 22, 2025

(54) TRANSDUCER COMPONENT, MANUFACTURING METHOD THEREOF, AND TRANSDUCER

(71) Applicant: BOE TECHNOLOGY GROUP CO., LTD., Beijing (CN)

(72) Inventors: Yongchun Tao, Beijing (CN); Ruituo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 356 days.

(21) Appl. No.: 17/641,284

(22) PCT Filed: Jan. 15, 2021

(86) PCT No.: PCT/CN2021/072205
§ 371 (c)(1),
(2) Date: Mar. 8, 2022

(87) PCT Pub. No.: WO2021/143862
PCT Pub. Date: Jul. 22, 2021

(65) Prior Publication Data
US 2022/0289558 A1    Sep. 15, 2022

(30) Foreign Application Priority Data

Jan. 16, 2020   (CN) .......................... 202010047412.6

(51) Int. Cl.
*B81B 3/00* (2006.01)
*B81B 7/02* (2006.01)
*B81C 1/00* (2006.01)

(52) U.S. Cl.
CPC .............. *B81B 3/0021* (2013.01); *B81B 7/02* (2013.01); *B81C 1/00158* (2013.01); *B81B 2203/0127* (2013.01); *B81B 2203/04* (2013.01)

(58) Field of Classification Search
CPC . B81B 3/0021; B81B 7/02; B81B 2203/0127; B81B 2203/04; B81B 2207/053
See application file for complete search history.

(56) References Cited

U.S. PATENT DOCUMENTS

2012/0256519 A1   10/2012   Tomiyoshi et al.
2012/0256520 A1   10/2012   Torashima et al.
(Continued)

FOREIGN PATENT DOCUMENTS

CN        1883822 A     12/2006
CN      102728534 A     10/2012
(Continued)

OTHER PUBLICATIONS

Office Action for the Chinese Patent Application No. 202010047412.6 issued by the Chinese Patent Office on Apr. 24, 2023.

*Primary Examiner* — Moazzam Hossain
(74) *Attorney, Agent, or Firm* — XSENSUS LLP

(57) ABSTRACT

A transducer element includes array elements. At least one array element includes a substrate and a first electrode layer, a diaphragm layer, and a second electrode layer that are sequentially stacked thereon. An array element has a working region including working sub-regions, and a peripheral region surrounding the working region; overlapping portions of the first electrode layer, the diaphragm layer and the second electrode layer form cells, and a cell is located in a working sub-region; portions of the diaphragm layer and portions of the first electrode layer that are located in the working sub-regions have cavities therebetween, and the portions of the diaphragm layer are configured to vibrate in a direction perpendicular to the substrate between the first and second electrode layers; two adjacent cavities communicate; the diaphragm layer has release holes located in the peripheral region; and a release hole communicates with at least one cavity.

17 Claims, 28 Drawing Sheets

(56) References Cited

U.S. PATENT DOCUMENTS

2014/0313861 A1* 10/2014 Torashima ............ B06B 1/0292
367/181
2017/0056925 A1* 3/2017 Torashima ............ H10N 30/076

FOREIGN PATENT DOCUMENTS

| CN | 105728304 | A |   | 7/2016  |            |
|----|-----------|---|---|---------|------------|
| CN | 107226450 | A | * | 10/2017 | B81B 3/0035 |
| CN | 108190828 | A | * | 6/2018  | A61B 5/0053 |
| CN | 109261477 | A |   | 1/2019  |            |
| CN | 109734047 | A |   | 5/2019  |            |
| CN | 109831729 | A |   | 5/2019  |            |
| CN | 110008929 | A |   | 7/2019  |            |
| GB | 2266960   | A |   | 11/1993 |            |
| JP | 2009-165931 | A |  | 7/2009  |            |
| JP | 2011-254281 | A |  | 12/2011 |            |
| WO | 2015/159427 | A1 | | 10/2015 |            |

* cited by examiner

TRANSDUCER COMPONENT, MANUFACTURING METHOD THEREOF, AND TRANSDUCER

CROSS-REFERENCE TO RELATED APPLICATIONS

This application is a national phase entry under 35 USC 371 of International Patent Application No. PCT/CN2021/ 072205, filed on Jan. 15, 2021, which claims priority to Chinese Patent Application No. 202010047412.6, filed on Jan. 16, 2020, which are incorporated herein by reference in their entirety.

TECHNICAL FIELD

The present disclosure relates to the field of transducer technologies, and in particular, to a transducer component and a manufacturing method thereof, and a transducer.

BACKGROUND

Transducers are widely applied to medical imaging and treatment, industrial flow meters, automotive radars, indoor positioning, etc., and especially in the medical imaging, the transducers, X-ray, and nuclear magnetic resonance imaging are referred to as three major medical imaging technologies.

A capacitive micro-machined ultrasonic transducer (CMUT) developed on a basis of micro-electromechanical systems (MEMS) has become a strong competitor of other types of transducers (e.g., a piezoelectric transducer) due to its characteristics of good consistency, wide frequency band, etc.

The capacitive micro-machined ultrasonic transducer includes a transducer component, i.e., a CMUT chip. At present, processing methods of the transducer component are a wafer bonding process and a surface micromachining process. The wafer bonding process requires productions of diaphragms and cavities on two wafers, and the two wafers are bonded together through wafer bonding, which causes high production costs and high alignment accuracy requirement for a bonding equipment, so that it is difficult to be suitable for manufacturing the transducer component with a large area. However, the surface micromachining process is simple in manufacturing process and low in cost, and is more suitable for manufacturing the transducer component.

SUMMARY

In an aspect, a transducer component is provided. The transducer component includes a plurality of array elements. At least one of the plurality of array elements includes: a substrate; and a first electrode layer, a diaphragm layer, and a second electrode layer that are sequentially stacked on the substrate. The first electrode layer and the second electrode layer are insulated from each other. The array element has a working region and a peripheral region surrounding the working region, and the working region includes a plurality of working sub-regions. Overlapping portions of the first electrode layer, the diaphragm layer, and the second electrode layer form a plurality of cells located in the working region, and a cell is located in a working sub-region. Portions of the diaphragm layer located in the plurality of working sub-regions and portions of the first electrode layer located in the plurality of working sub-regions have a plurality of cavities therebetween, and the portions of the diaphragm layer located in the plurality of working sub-regions are configured to vibrate in a direction perpendicular to the substrate between the first electrode layer and the second electrode layer to perform signal conversion; and two adjacent cavities communicate with each other. The diaphragm layer has a plurality of release holes, and the plurality of release holes are located in the peripheral region. A release hole communicates with at least one cavity.

In some embodiments, the array element further includes a plurality of connection channels disposed on sides, proximate to the first electrode layer, of portions of the diaphragm layer that are located outside the plurality of working sub-regions. The two adjacent cavities communicate with each other through a connection channel. The release hole communicates with at least one cavity adjacent thereto through connection channel(s).

In some embodiments, the plurality of cavities are arranged in rows in a first direction and in columns in a second direction; and the first direction intersects with the second direction. In the first direction, any two adjacent cavities communicate through a connection channel; and in the second direction, any two adjacent cavities communicate through a connection channel. And/or, in a third direction, any two adjacent cavities communicate through a connection channel; in a fourth direction, any two adjacent cavities communicate through a connection channel; and the third direction is a direction of an angle bisector between the first direction and the second direction, and the fourth direction is perpendicular to the third direction.

In some embodiments, a direction in which a connection channel connected to the release hole and a cavity extends has an included angle with the first direction, and/or, a direction in which a connection channel connected to the release hole and a cavity extends has an included angle with the second direction.

In some embodiments, the release hole communicates with a cavity through a connection channel in the third direction or the fourth direction.

In some embodiments, orthogonal projections of the connection channels on the substrate do not overlap with at least one of orthogonal projections of the first electrode layer and the second electrode layer on the substrate.

In some embodiments, the first electrode layer includes a plurality of first electrodes and a plurality of first connection electrodes; a first connection electrode connects two adjacent first electrodes, and the first electrode is located in a working sub-region; and orthogonal projections of the plurality of first connection electrodes on the substrate do not overlap with orthogonal projections of the plurality of connection channels on the substrate. And/or, the second electrode layer includes a plurality of second electrodes and a plurality of second connection electrodes; a second connection electrode connects two adjacent second electrodes, and the second electrode is located in a working sub-region; and orthogonal projections of the plurality of second connection electrodes on the substrate do not overlap with the orthogonal projections of the plurality of connection channels on the substrate.

In some embodiments, the array element further includes a filling layer disposed on a side of the diaphragm layer away from the substrate; and the filling layer includes a plurality of filling patterns. At least a portion of a filling pattern is located in the release hole, and an orthogonal projection of the release hole on the substrate coincides with an orthogonal projection of the filling pattern on the substrate, or an orthogonal projection of the release hole on the substrate is located within an orthogonal projection of the filling pattern on the substrate.

In some embodiments, the array element further includes an etch stop layer disposed between the first electrode layer and the diaphragm layer. Orthogonal projections of the plurality of cavities on the substrate and orthogonal projections of the plurality of release holes on the substrate are located within an orthogonal projection of the etch stop layer on the substrate. At least one of the etch stop layer and the diaphragm layer is made of an insulating material.

In some embodiments, the array element further includes a passivation layer disposed on a side of the second electrode layer away from the substrate; and the passivation layer has a plurality of openings. The first electrode layer includes at least one first connection pad, and the second electrode layer includes at least one second connection pad. The plurality of openings expose the at least one first connection pad and the at least one second connection pad. An orthogonal projection of the diaphragm layer on the substrate does not overlap with orthogonal projection(s) of the at least one first connection pad on the substrate. In a case where the array element further includes the etch stop layer, the orthogonal projection of the etch stop layer on the substrate does not overlap with the orthogonal projection(s) of the at least one first connection pad on the substrate.

In another aspect, a transducer is provided. The transducer includes the transducer component as described in any of the above embodiments.

In yet another aspect, a manufacturing method of a transducer component is provided. The manufacturing method of the transducer component includes: forming a plurality of array elements. Forming an array element of the plurality of array elements includes: providing a substrate; forming a first electrode layer, a diaphragm layer, and a second electrode layer that are sequentially stacked on the substrate; and the first electrode layer and the second electrode layer being insulated from each other. The array element has a working region and a peripheral region surrounding the working region, and the working region includes a plurality of working sub-regions; overlapping portions of the first electrode layer, the diaphragm layer, and the second electrode layer form a plurality of cells located in the working region, and a cell is located in a working sub-region; portions of the diaphragm layer located in the plurality of working sub-regions and portions of the first electrode layer located in the plurality of working sub-regions have a plurality of cavities therebetween, and the portions of the diaphragm layer located in the plurality of working sub-regions are configured to vibrate in a direction perpendicular to the substrate between the first electrode layer and the second electrode layer to perform signal conversion; two adjacent cavities communicate with each other; the diaphragm layer has a plurality of release holes, and the plurality of release holes are located in the peripheral region; and a release hole communicates with at least one cavity.

In some embodiments, the array element further includes a plurality of connection channels disposed on sides, proximate to the first electrode layer, of portions of the diaphragm layer that are located in regions outside the plurality of working sub-regions; and forming the first electrode layer, the diaphragm layer, and the second electrode layer that are sequentially stacked on the substrate, and forming the plurality of cavities and the plurality of connection channels, includes: forming the first electrode layer on the substrate; forming a sacrificial layer on a surface of the first electrode layer away from the substrate, the sacrificial layer including a plurality of sacrificial patterns and a plurality of sacrificial channels, two adjacent sacrificial patterns being connected through a sacrificial channel, and the plurality of sacrificial patterns being located in the plurality of working sub-regions; forming a diaphragm film on a surface of the sacrificial layer away from the substrate; patterning the diaphragm film to form the plurality of release holes, so as to obtain the diaphragm layer, the plurality of release holes exposing portions of the sacrificial layer; removing the plurality of sacrificial patterns in the sacrificial layer through the plurality of release holes to form the plurality of cavities, and removing the plurality of sacrificial channels in the sacrificial layer to form the plurality of connection channels, two adjacent cavities communicating with each other through a connection channel, and the release hole communicating with at least one cavity adjacent thereto through connection channel(s); and forming the second electrode layer on a surface of the diaphragm layer away from the substrate.

In some embodiments, before the second electrode layer is formed, the manufacturing method of the transducer component further includes: forming a filling film on the surface of the diaphragm layer away from the substrate, portions of the filling film being located in the plurality of release holes; and patterning the filling film to form a plurality of filling patterns, so as to obtain a filling layer. At least a portion of a filling pattern is located in a release hole; and an orthogonal projection of the release hole on the substrate coincides with an orthogonal projection of the filling pattern on the substrate, or an orthogonal projection of the release hole on the substrate is located within an orthogonal projection of the filling pattern on the substrate.

In some embodiments, the array element further includes a plurality of connection channels disposed on sides, proximate to the first electrode layer, of portions of the diaphragm layer that are located in regions outside the plurality of working sub-regions; and forming the first electrode layer, the diaphragm layer, and the second electrode layer that are sequentially stacked on the substrate, and forming the plurality of cavities and the plurality of connection channels, includes: forming the first electrode layer on the substrate; forming a sacrificial layer on a surface of the first electrode layer away from the substrate, the sacrificial layer including a plurality of sacrificial patterns and a plurality of sacrificial channels, two adjacent sacrificial patterns being connected through a sacrificial channel, and the plurality of sacrificial patterns being located in the plurality of working sub-regions; forming a diaphragm film on a surface of the sacrificial layer away from the substrate; forming the second electrode layer on the surface of the diaphragm film away from the substrate; patterning the diaphragm film to form the plurality of release holes, so as to obtain the diaphragm layer, the plurality of release holes exposing portions of the sacrificial layer; and removing the plurality of sacrificial patterns in the sacrificial layer through the plurality of release holes to form the plurality of cavities, and removing the plurality of sacrificial channels in the sacrificial layer to form the plurality of connection channels, two adjacent cavities communicating with each other through a connection channel, and the release hole communicating with at least one cavity adjacent thereto through connection channel(s).

In some embodiments, after the plurality of cavities and the plurality of connection channels are formed, the manufacturing method of the transducer component further includes: forming a filling film on a surface of the diaphragm layer away from the substrate, portions of the filling film being located in the plurality of release holes; patterning the filling film to form a plurality of filling patterns, so as to obtain a filling layer. At least a portion of a filling pattern is located in a release hole; and an orthogonal projection of the release hole on the substrate coincides with an orthogonal projection of the filling pattern on the substrate; or an orthogonal projection of the release hole on the substrate is located within an orthogonal projection of the filling pattern on the substrate.

In some embodiments, at least one of orthogonal projections of the first electrode layer and the second electrode layer on the substrate does not overlap with orthogonal projections of the plurality of sacrificial channels on the substrate.

In some embodiments, the manufacturing method of the transducer component further includes: forming a passivation film on the substrate on which the second electrode layer has been formed; patterning the passivation film to form a plurality of openings, so as to obtain a passivation layer, wherein the first electrode layer includes at least one first connection pad, the second electrode layer includes at least one second connection pad, and the plurality of openings expose the at least one first connection pad and the at least one second connection pad; and an orthogonal projection of the diaphragm layer on the substrate does not overlap with orthogonal projection(s) of the at least one first connection pad on the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, and actual processes of methods involved in the embodiments of the present disclosure.

DETAILED DESCRIPTION

Figure 1:
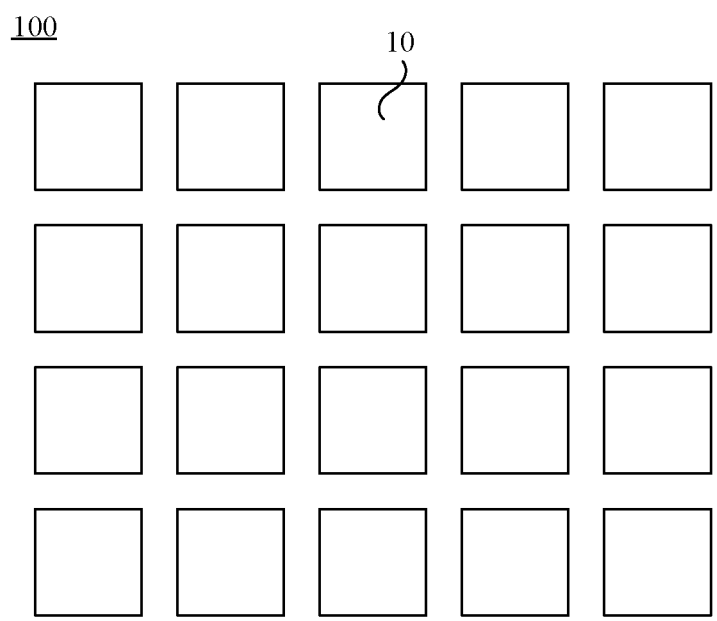
FIG. 1 is a diagram illustrating a structure of a transducer component, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" means openness and inclusiveness, since a process, step, calculation or other action that is "based on" one or more of the stated conditions or values may, in practice, be based on additional conditions or values exceeding those stated.

Terms such as "about", "substantially" or "approximately" as used herein include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions may be exaggerated for clarity. Variations in shapes with respect to the drawings due to, for example, manufacturing technologies and/or tolerances may be conceivable. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Figure 25:
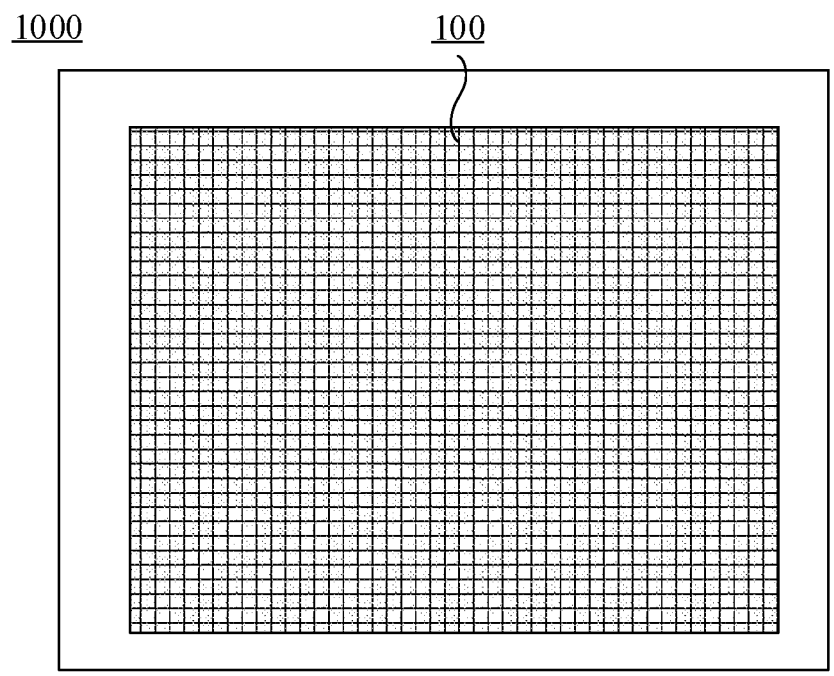
FIG. 25 is a diagram illustrating a structure of a transducer, in accordance with some embodiments of the present disclosure.

As shown in FIG. 25, some embodiments of the present disclosure provide a transducer 1000.

For example, the transducer 1000 may be a capacitive micromechanical transducer.

In some examples, the transducer 1000 may include: a transducer component 100, a signal processing circuit, and an excitation circuit. The signal processing circuit includes an amplifier.

In some examples, the transducer 1000 may be an ultrasonic transducer.

A structure of the transducer component 100 included in the transducer 1000 will be schematically described below.

As shown in FIG. 1, the transducer component 100 provided in some embodiments of the present disclosure includes a plurality of array elements 10.

The number of array elements 10 in the transducer component 100 and an arrangement of the plurality of array elements 10 are not limited in the present disclosure.

For example, as shown in FIG. 1, the plurality of array elements 10 are arranged in an array.

In some examples, as shown in FIGS. 2 to 5, 7, and 9, at least one array element 10 of the plurality of array elements 10 includes: a substrate 1, and a first electrode layer 2, a diaphragm layer 3, and a second electrode layer 4 that are sequentially stacked on the substrate 1. For example, all the array elements 10 may have the same structure, and each include the substrate 1, the first electrode layer 2, the diaphragm layer 3, and the second electrode layer 4; or, a part of the plurality of array elements 10 may have the same structure, and each include: the substrate 1, the first electrode layer 2, the diaphragm layer 3, and the second electrode layer 4; or, one of the plurality of array elements 10 includes the substrate 1, the first electrode layer 2, the diaphragm layer 3, and the second electrode layer 4.

The substrate 1 has a certain strength, so as to bear the first electrode layer 2, the diaphragm layer 3, and the second electrode layer 4.

For example, the substrate 1 may be a glass substrate.

A material of the first electrode layer 2 and a material of the second electrode layer 4 are not limited in the present disclosure.

For example, the material of the first electrode layer 2 may be one of a metal element, an alloy, and a metal oxide, and the material of the second electrode layer 4 may be one of a metal element, an alloy, and a metal oxide. The metal element may be, for example, copper (Cu), aluminum (Al), or silver (Ag). The alloy may be, for example, a copper alloy, an aluminum alloy, or a silver alloy. The metal oxide may be, for example, indium zinc oxide (IZO), indium tin oxide (ITO), or indium gallium zinc oxide (IGZO).

In addition, the material of the first electrode layer 2 and the material of the second electrode layer 4 may be the same or different.

In some examples, the first electrode layer 2 and the second electrode layer 4 are insulated from each other. That is, a material of film(s) provided between the first electrode layer 2 and the second electrode layer 4 may include an insulating material.

For example, in a case where only the diaphragm layer 3 is provided between the first electrode layer 2 and the second electrode layer 4, the diaphragm layer 3 is made of the insulating material to ensure that the first electrode layer 2 and the second electrode layer 4 are insulated from each other. In a case where the diaphragm layer 3 and other films are provided between the first electrode layer 2 and the second electrode layer 4, the diaphragm layer 3 may be made of the insulating material or a non-insulating material, and the other films are made of the insulating material.

In some examples, as shown in FIGS. 2, 6, 8, and 10, the array element 10 has a working region A and a peripheral region B surrounding the working region A. The working region A includes a plurality of working sub-regions A1. The plurality of working sub-regions A1 may be, for example, arranged in an array.

For example, as shown in FIGS. 3 to 5, 7, and 9, the first electrode layer 2, the diaphragm layer 3, and the second electrode layer 4 overlap to form a plurality of cells C located in the working region A, and a cell C is located in a working sub-region A1. A plurality of cavities D are provided between portions of the diaphragm layer 3 located in the working sub-regions A1 and the first electrode layer 2, and the portions of the diaphragm layer 3 located in the working sub-regions A1 may vibrate in a direction perpendicular to the substrate 1 between the first electrode layer 2 and the second electrode layer 4, so as to perform signal conversion. The direction perpendicular to the substrate 1 is a thickness direction of the substrate 1.

In this case, each cell C includes: a portion of the first electrode layer 2 located in a corresponding working sub-region A1, a portion of the diaphragm layer 3 located in the corresponding working sub-region A1, and a portion of the second electrode layer 4 located in the corresponding working sub-region A1. The portion of the diaphragm layer 3 located in the corresponding working sub-region A1 and the portion of the first electrode layer 2 located in the corresponding working sub-region A1 have a cavity D therebetween. The portion of the first electrode layer 2 located in the corresponding working sub-region A1, the portion of the diaphragm layer 3 located in the corresponding working sub-region A1, the portion of the second electrode layer 4 located in the corresponding working sub-region A1, and the cavity D constitute a capacitor. If the first electrode layer 2, the diaphragm layer 3, and the second electrode layer 4 overlap, and there is no cavity D between overlapping portions of the diaphragm layer 3 and the first electrode layer 2, overlapping portions of the first electrode layer 2, the diaphragm layer 3, and the second electrode layer 4 do not constitute the cell C.

Referring to FIGS. 3 to 5, 7, and 9, since the cavity D is provided between the portion of the diaphragm layer 3 located in the working sub-region A1 and the first electrode layer 2, during an operating process of the transducer component 100, the signal conversion may be performed through vibration of the portion of the diaphragm layer 3 located in the working sub-region A1 between the first electrode layer 2 and the second electrode layer 4.

An acoustic signal is taken as an example. When the acoustic signal is applied to the transducer component 100, due to an action of the acoustic signal, a portion of the diaphragm layer 3 located in a working sub-region A1 may vibrate in the direction perpendicular to the substrate 1 between the first electrode layer 2 and the second electrode layer 4, which leads to a change in capacitance of a capacitor including the portion of the diaphragm layer 3 located in the working sub-region A1. By detecting the change in the capacitance, a conversion between the acoustic signal and an electrical signal is realized. Accordingly, the electrical signal (e.g., an alternating current signal) is applied to the first electrode layer 2 and the second electrode layer 4, and due to an action of the electrical signal, the portion of the diaphragm layer 3 located in the working sub-region A1 may vibrate in the direction perpendicular to the substrate 1 between the first electrode layer 2 and the second electrode layer 4. By detecting a change in a vibration, a conversion between the electrical signal and the acoustic signal is realized.

In addition, it will be understood that, except the portions of the diaphragm layer 3 located in the working sub-regions A1, at least a part of other portions of the diaphragm layer 3 should not vibrate. That is, distance(s) between the part of the other portions of the diaphragm layer 3 and the first electrode layer 2 maintain unchanged; or the part of the other portions of the diaphragm layer 3 is in contact with the first electrode layer 2.

Figure 3:
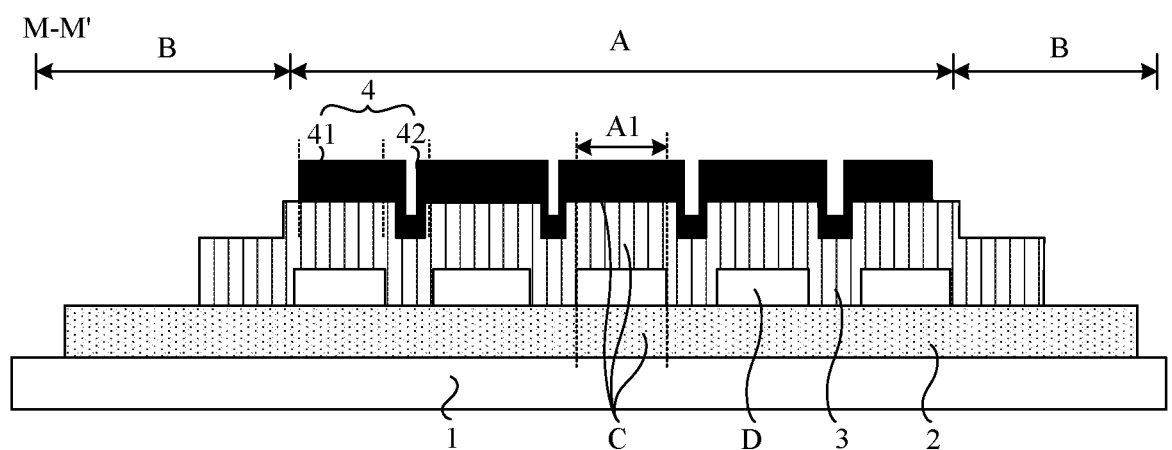
FIG. 3 is a sectional view illustrating the array element shown in FIG. 2 taken along the line M-M'.

For example, referring to FIG. 3, there is no cavity D between a portion of the diaphragm layer 3 located between two adjacent working sub-regions A1 and the first electrode layer 2, and the portion of the diaphragm layer 3 located between the two adjacent working sub-regions A1 does not vibrate.

Figure 4:
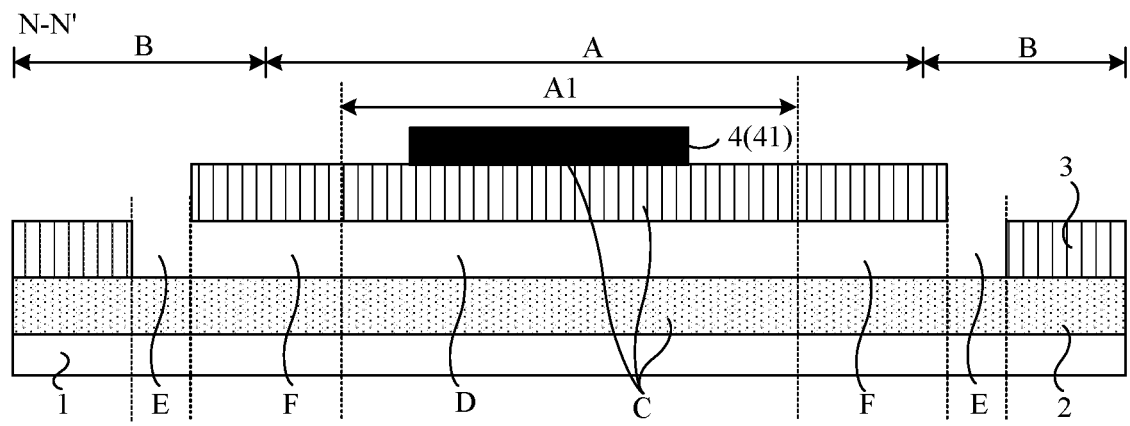
FIG. 4 is a sectional view illustrating the array element shown in FIG. 2 taken along the line N-N'.
Figure 5:
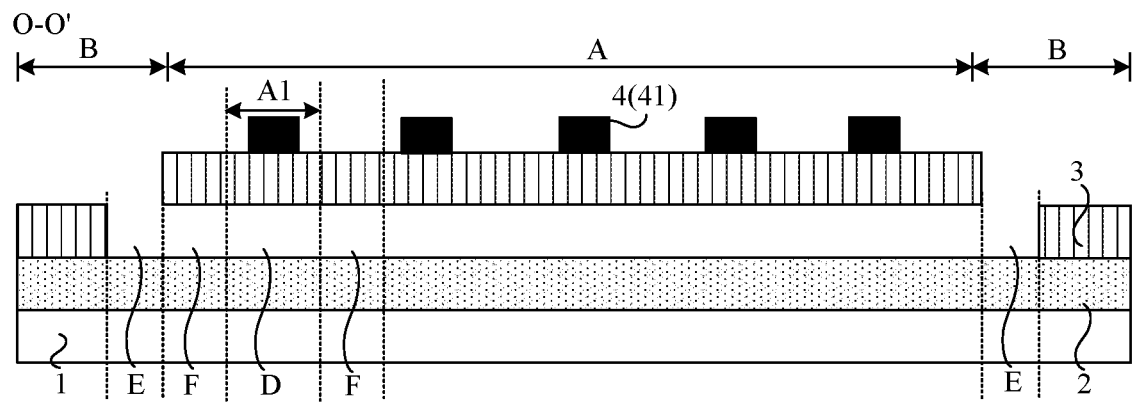
FIG. 5 is a sectional view illustrating the array element shown in FIG. 2 taken along the line O-O'.

For another example, referring to FIGS. 4 and 5, a portion of the diaphragm layer 3 located in the peripheral region B does not vibrate.

Figure 2:
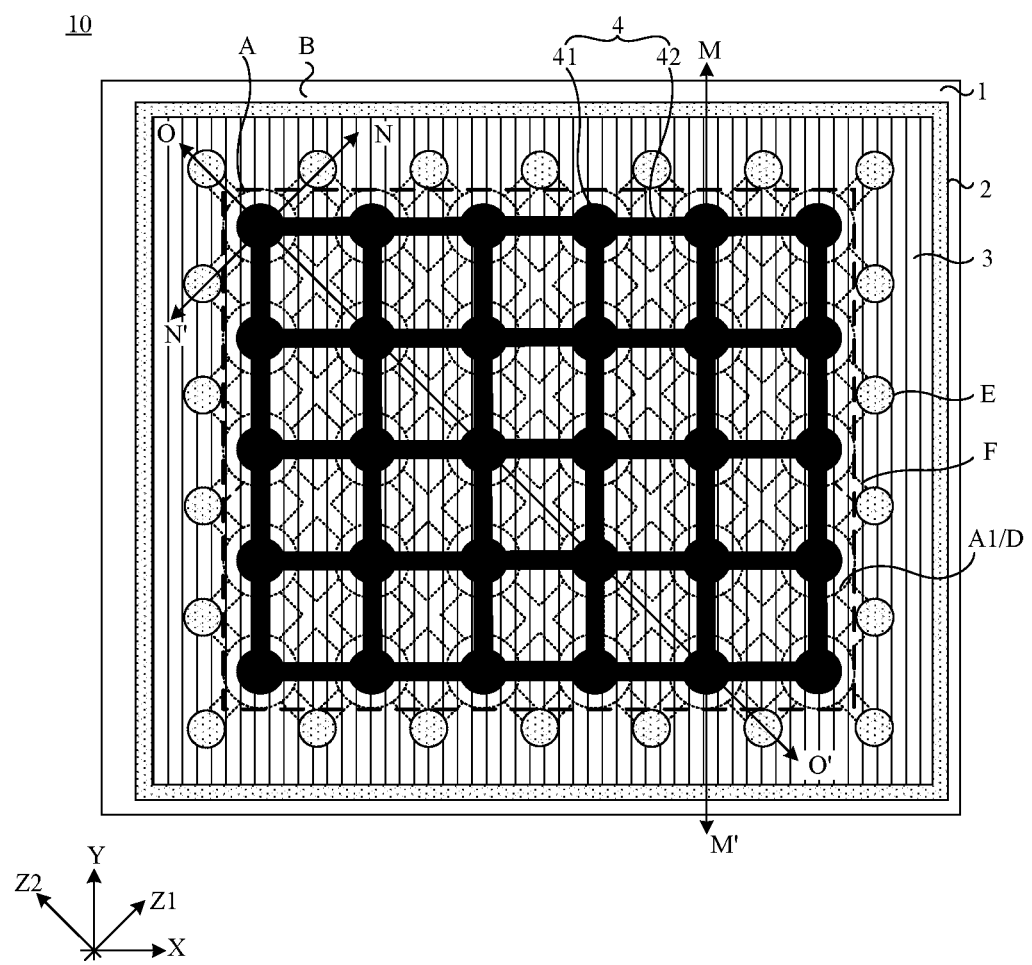
FIG. 2 is a diagram illustrating a structure of an array element, in accordance with some embodiments of the present disclosure.

It will be noted that, as shown in FIG. 2, the dotted circle represents the cavity D, and an orthogonal projection of the cavity D on the substrate 1 overlaps with an orthogonal projection of the portion of the diaphragm layer 3 located in the working sub-region A1 on the substrate 1; and the dashed lines represent connection channels F. For the description of the connection channels F, reference can be made to the following, which will not be repeated here. A connection channel F communicates a release hole E in the diaphragm layer 3 with a cavity D, and adjacent cavities D communicate through connection channels F.

The number of working sub-regions A1 of the array element 10 or the number of cells C located in the working sub-regions A1 of the array element 10 is not limited in the present disclosure. The greater the number of working sub-regions A1 or the number of cells C that are located in the working sub-regions A1 is, the higher transmitting and receiving sensitivities of the array element 10 are, and the higher a detection sensitivity of the transducer component 100 is. FIG. 3 shows five working sub-regions A1, and FIG. 4 shows only one working sub-region A1.

Based on this, a shape of the working sub-region A1 is not limited in the present disclosure. For example, the shape of the working sub-region A1 may be circular, rectangular, or rhombic. The drawings of the present disclosure are all schematically illustrated by taking an example in which the shape of the working sub-region A1 is the circular.

In some examples, as shown in FIGS. 2, 4 to 10, the diaphragm layer 3 has a plurality of release holes E. The plurality of release holes E are located in the peripheral region B.

For example, as shown in FIGS. 2, 6, 8, and 10, the plurality of release holes E are sequentially arranged at intervals (e.g., arranged at equal intervals), and are arranged around the working region A, and surround the working region A.

In some examples, as shown in FIGS. 2, 6, 8, and 10, two adjacent cavities D communicate with each other, and this communication refers to a direct communication.

For example, the two adjacent cavities D may be any two adjacent cavities D. In a case where the two adjacent cavities D communicate with each other, the plurality of cavities D between the diaphragm layer 3 and the first electrode layer 2 may communicate with one another. That is, any two of the plurality of cavities D may communicate with each other.

In some examples, as shown in FIGS. 2, 6, 8, and 10, a release hole E communicates with at least one cavity D. That is, the release hole E may communicate with one or more cavities D. This communication refers to a direct communication.

Here, the release hole E and the cavity D communicating with the release hole E may be adjacent, and there is no other cavity D or other release hole E therebetween. Of course, the release hole E and the cavity D communicating with the release hole E may have other cavity D therebetween.

In a case where the two adjacent cavities D communicate with each other, and the release hole E communicates with the at least one cavity D, the release hole E may achieve a communication (e.g., the direct communication or an indirect communication) with any cavity D of the at least one cavity D.

For example, in a process of manufacturing the array element 10, steps of forming the diaphragm layer 3 may be: forming a sacrificial layer on the substrate 1, the sacrificial layer including a plurality of sacrificial patterns; forming a diaphragm film on a surface of the sacrificial layer away from the substrate 1, and etching the diaphragm film to form the diaphragm layer 3 with the plurality of release holes E; and then removing the sacrificial layer through the plurality of release holes E in the diaphragm layer 3. The cavities D are formed between portions of the diaphragm layer 3 corresponding to the sacrificial patterns and the first electrode layer 2. For the description of the sacrificial layer, reference can be made to the following, which will not repeated here.

Figure 15:
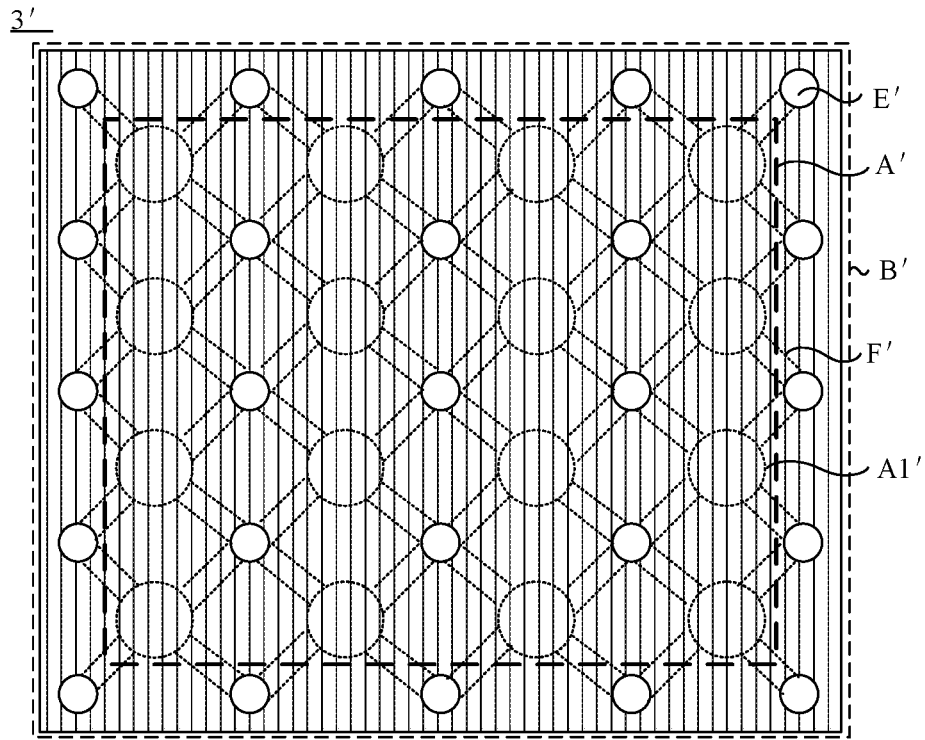
FIG. 15 is a diagram illustrating a structure of a diaphragm layer, in accordance with an implementation manner.

In an implementation manner, a structure of a diaphragm layer 3' in a transducer component is as shown in FIG. 15. Some release holes E' in a plurality of release holes E' of the diaphragm layer 3' are located in a periphery of each working sub-region A1'. That is, a part of the plurality of release holes E' of the diaphragm layer 3' is located in a working region A', so as to increase a speed of removing a sacrificial layer. However, in this way, a spacing between two adjacent working sub-regions A1' increases, and a gap between two adjacent cells C' increases. Since the plurality of release holes E' of the diaphragm layer 3' are located in both a peripheral region B' and the working region A', an area of the working sub-regions A1' occupies a small proportion of an area of the working region A', so that the number of cells C' located in the working region A' is small. As a result, transmitting and receiving sensitivities of the transducer component in the implementation manner are low, which leads to a low detection sensitivity of the transducer in the implementation manner.

Based on this, in the embodiments of the present disclosure, the plurality of release holes E of the diaphragm layer 3 are only disposed in the peripheral region B, instead of being disposed in the working region A, which may reduce a spacing between two adjacent working sub-regions A1 in the working region A, and reduce a gap between the cells C located in the working sub-regions A1. In this way, it is beneficial to increase the number of working sub-regions A1 and the number of cells C, and further, it is beneficial to improve the transmitting and receiving sensitivities of the array element 10 and the detection sensitivity of the transducer component 100.

Therefore, in the transducer component 100 provided in some embodiments of the present disclosure, the first electrode layer 2, the diaphragm layer 3, and the second electrode layer 4 are sequentially stacked in each array element 10 of the at least one array element 10 included in the transducer component 100, the first electrode layer 2 and the second electrode layer 4 are insulated from each other, and the cavities D are provided between the portions of the diaphragm layer 3 located in the working sub-regions A1 and the first electrode layer 2, which may make the portions of the diaphragm layer 3 located in the working sub-regions A1 vibrate in the direction perpendicular to the substrate 1, so that the array element 10 realizes conversion between an acoustic signal and an electrical signal.

In addition, in the embodiments of the present disclosure, the release holes E of the diaphragm layer 3 are disposed in the peripheral region B, each release hole E is communicates with at least one cavity D, and two adjacent cavities D communicate with each other, which may achieve the communication between each release hole E and any cavity D. In this way, it is possible to reduce the number of release holes E while forming the diaphragm layer 3, prevent the release holes E from being arranged in the working region A, increase the number of working sub-regions A1 in the work region A, and help to increase the number of cells C in the work region A. As a result, it is beneficial to improve the transmitting and receiving sensitivities of the array element 10, the transmitting and receiving sensitivities of the transducer component 100, and the transmitting and detection sensitivities of the transducer 1000 to which the transducer component 100 is applied.

In some embodiments, as shown in FIGS. 2, 6, 8, and 10, a plurality of connection channels F are provided between portions of the diaphragm layer 3 located in regions outside the working sub-regions A1 and the first electrode layer 2.

In some examples, the regions outside the working sub-regions A1 include: a region of the working region A except the working sub-regions A1, and the peripheral region B.

Based on this, a part of the connection channels F may be located in the region in the working region A except the working sub-regions A1, and another part of the connection channels F may be located in the peripheral region B.

For example, as shown in FIGS. 2, 6, 8, and 10, two adjacent cavities D communicate with each other through the connection channel F. Since the cavities D are located in the working region A, the two adjacent cavities D communicate with each other through the connection channel F located in the region of the working region A except the working sub-regions A1.

For example, as shown in FIGS. 2, 6, 8, and 10, the release hole E communicates with at least one cavity D adjacent to the release hole E through connection channel(s) F. The at least one cavity D is located at an edge of the working region A, and no other cavities D are provided between the at least one cavity D and the release hole E adjacent to the at least one cavity D. Since the release hole E is located in the peripheral region B, the release hole E may communicate with the at least one cavity D adjacent to the at least one cavity D through connection channel(s) F located in the peripheral region B.

Here, the working sub-regions A1 are arranged in an array, and the cavities D between the diaphragm layer 3 and the first electrode layer 2 may also be arranged in an array.

In some embodiments, as shown in FIGS. 2, 6, 8, and 10, the cavities D are arranged in rows in a first direction X and in columns in a second direction Y. Each row of cavities D may include cavities D, and each column of cavities D may include cavities D.

For example, the first direction X intersects with the second direction Y. An angle between the first direction X and the second direction Y may be selectively set according to actual needs. For example, the first direction X and the second direction Y are perpendicular to each other.

Figure 13:
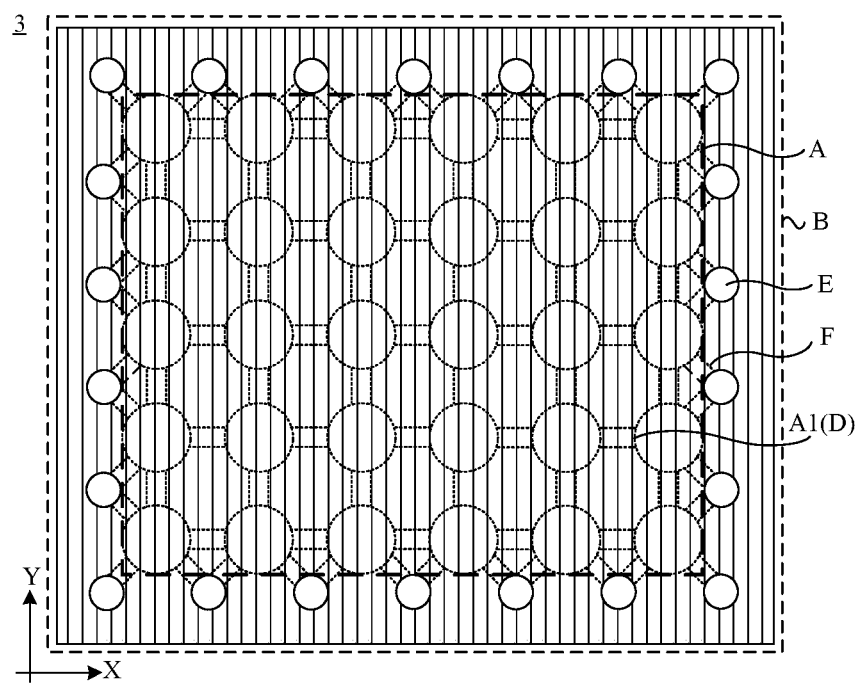
FIG. 13 is a diagram illustrating a structure of another diaphragm layer, in accordance with some embodiments of the present disclosure.

In some examples, as shown in FIG. 13, in the first direction X, any two adjacent cavities D communicate with each other through a connection channel F; and in the second direction Y, any two adjacent cavities D communicate with each other through a connection channel F.

In this case, cavities D in each row arranged in the first direction X are communicated, cavities D in each column arranged in the second direction Y are communicated, and each row of cavities D and each column of cavities D communicate through a cavity D located at an intersection position thereof.

Figure 12:
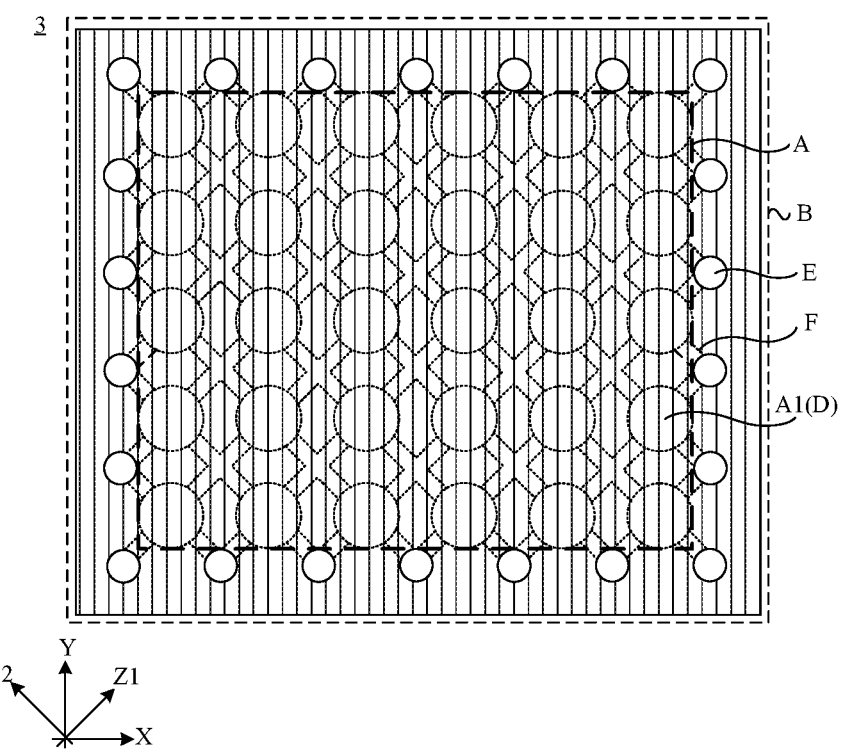
FIG. 12 is a diagram illustrating a structure of a diaphragm layer, in accordance with some embodiments of the present disclosure.

In some other examples, as shown in FIG. 12, in a third direction Z1, any two adjacent cavities D communicate through a connection channel F; and in a fourth direction Z2, any two adjacent cavities D communicate through a connection channel F. The third direction Z1 is a direction of an angle bisector between the first direction X and the second direction Y, and the fourth direction Z2 is perpendicular to the third direction Z1.

The first direction X and the second direction Y being perpendicular to each other is taken as an example. In this case, in the third direction Z1 with an angle of 45° to the first direction X, cavities D in each oblique row are communicated. In the fourth direction Z2 perpendicular to the third direction Z1, cavities D in each oblique row are communicated. The oblique row of cavities D in the third direction Z1 with the angle of 45° to the first direction X and the oblique row of cavities D in the fourth direction Z2 perpendicular to the third direction Z1 communicate through a cavity D located at an intersection position thereof.

Figure 14:
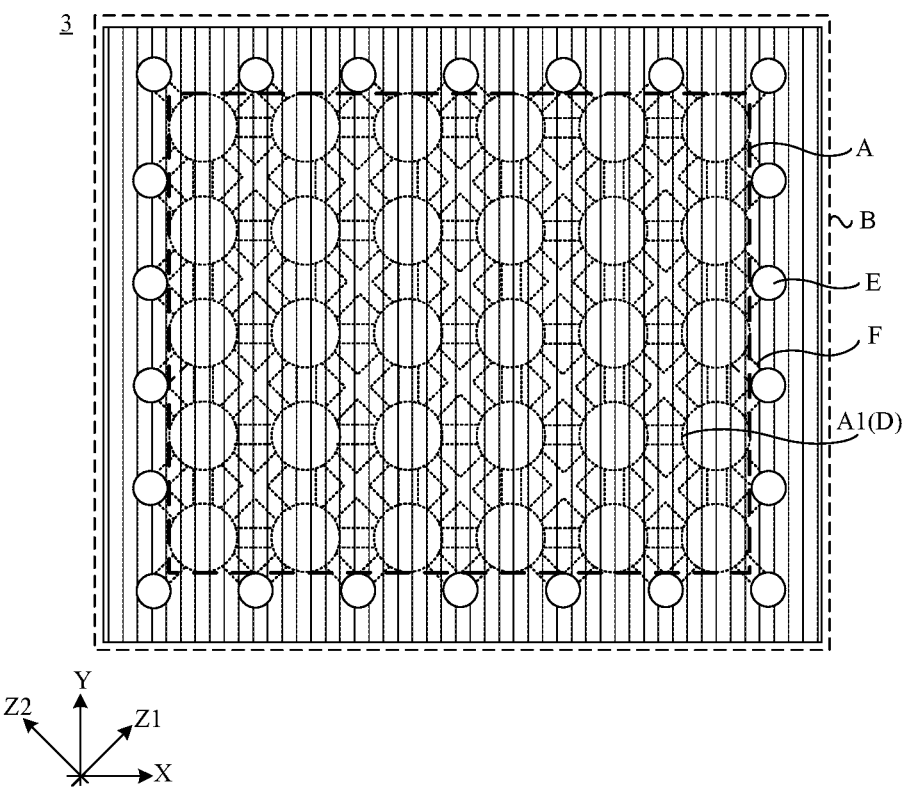
FIG. 14 is a diagram illustrating a structure of yet another diaphragm layer, in accordance with some embodiments of the present disclosure.

In yet other examples, as shown in FIG. 14, in the first direction X, any two adjacent cavities D communicate with each other through a connection channel F; in the second direction Y, any two adjacent cavities D communicate with each other through a connection channel F; and in a third direction Z1, any two adjacent cavities D communicate with each other through a connection channel F, in a fourth direction Z2, any two adjacent cavities D communicate with each other through a connection channel F. The third direction Z1 is a direction of an angle bisector between the first direction X and the second direction Y, the fourth direction Z2 is perpendicular to the third direction Z1.

The first direction X and the second direction Y being perpendicular to each other is taken as an example.

In this case, cavities D in each row arranged in the first direction X are communicated, cavities D in each column arranged in the second direction Y are communicated, and each row of cavities D and each column of cavities D communicate through a cavity D located at an intersection position thereof.

In the third direction Z1 with an angle of 45° to the first direction X, cavities D in each oblique row are communicated; in the fourth direction Z2 perpendicular to the third direction Z1, cavities D in each oblique row are communicated; and the oblique row of cavities D in the third direction Z1 with the angle of 45° to the first direction X and the oblique row of cavities D in the fourth direction Z2 perpendicular to the third direction communicate through a cavity D located at an intersection position thereof.

In some embodiments, as shown in FIGS. 12 to 14, a direction of a connection line between the release hole E and a cavity D has an included angle with the first direction X, and/or the direction of the connection line between the release hole E and the cavity D has an included angle with the second direction Y. The cavity D refers to one of the at least one cavity D adjacent to the release hole E. The direction of the connection line between the release hole E and the cavity D is a direction in which a connection channel F that is connected to the release hole E and the cavity D extends.

A size of the included angle may be selectively set according to actual needs, which is not limited in the present disclosure.

In some examples, as shown in FIGS. 12 to 14, the release hole E communicates with the cavity D through a connection channel F in the third direction Z1 or the fourth direction Z2.

That is, the release hole E and the cavity D connected thereto are arranged in the third direction Z1 or the fourth direction Z2.

In a case where the first direction X and the second direction Y are perpendicular to each other, the connection channel F that is connected to the release hole E and the cavity D extends in the third direction Z1 or the fourth direction Z2, the third direction Z1 being at an angle of 45° to the first direction X or at an angle of 45° to the second direction Y, and the fourth direction Z2 being perpendicular to the third direction Z1.

In some embodiments, as shown in FIGS. 2, 6, 8, and 10, in a case where two adjacent cavities D communicate through the connection channel F, an orthogonal projection of the connection channel F on the substrate 1 does not overlap with at least one of orthogonal projections of the first electrode layer 2 and the second electrode layer 4 on the substrate 1.

That is, the orthogonal projection of the connection channel F on the substrate 1 does not overlap with an orthogonal projection of the first electrode layer 2 on the substrate 1. Or, the orthogonal projection of the connection channel F on the substrate 1 does not overlap with an orthogonal projection of the second electrode layer 4 on the substrate 1. Or, the orthogonal projection of the connection channel F on the substrate 1 does not overlap with orthogonal projections of the first electrode layer 2 and the second electrode layer 4 on the substrate 1.

By adopting the above arrangement, it may avoid a vibration of the portion of the diaphragm layer 3 corresponding to the connection channel F, and ensure that only the portion of the diaphragm layer 3 located in the working sub-region A1 (i.e., a portion thereof corresponding to the cavity D) can vibrate in the direction perpendicular to the substrate 1 to perform the signal conversion, which prevents the portion of the diaphragm layer 3 corresponding to the connection channel F from adversely affecting the signal conversion, thereby ensuring an accuracy of the signal conversion, and further ensuring the transmitting and detection sensitivities of the transducer component 100 and the transducer 1000 to which the transducer component 100 is applied.

In a case where the two adjacent cavities D communicate through the connection channel F, there is a distance between a surface, proximate to the substrate 1, of portions of the diaphragm layer 3 that corresponds to the connection channel F and the cavity D and a surface, proximate to the substrate 1, of a portion of the diaphragm layer 3 that does not correspond to the connection channel F and the cavity D.

The first electrode layer 2 and the second electrode layer 4 have various structures, which may be selectively set according to actual needs.

Figure 11:
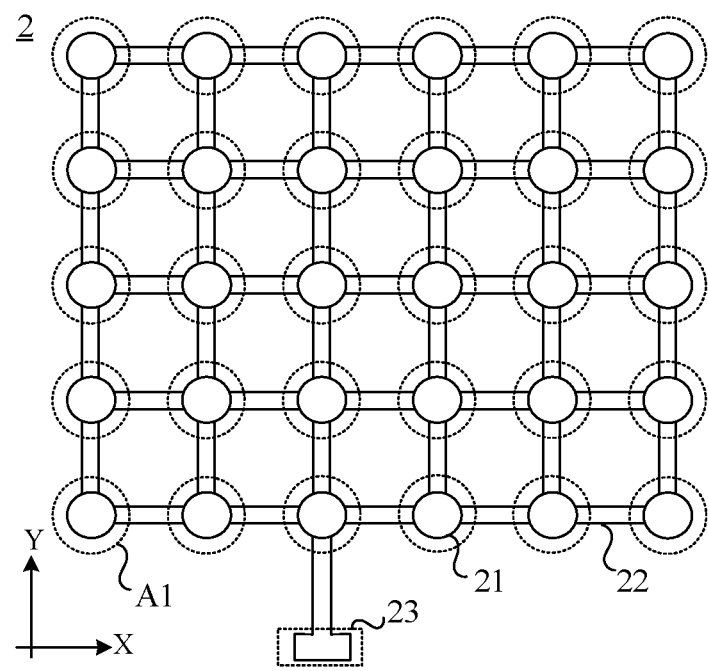
FIG. 11 is a diagram illustrating a structure of a first electrode layer, in accordance with some embodiments of the present disclosure.

In some embodiments, as shown in FIG. 11, the first electrode layer 2 includes a plurality of first electrodes 21. A first electrode 21 is located in a working sub-region A1, and the first electrode 21 located in the working sub-region A1 is a portion of a cell C corresponding to the working sub-region A1.

In some examples, as shown in FIG. 11, in the case where the first electrode layer 2 includes the plurality of first electrodes 21, the first electrode layer 2 may further include a plurality of first connection electrodes 22. A first connection electrode 22 may connect two adjacent first electrodes 21, and the plurality of first electrodes 21 may be electrically connected together through the plurality of first connection electrodes 22. In some other examples, the plurality of first electrodes 21 may not be connected to one another, and in this case, the array element 10 may be provided with signal lines to be electrically connected to the first electrodes 21 and provide electrical signals to the first electrodes 21.

The first electrodes 21 may be, for example, arranged in an array. In this case, the two adjacent first electrodes 21 may be any two adjacent first electrodes 21 in the first direction X, or any two adjacent first electrodes 21 in the second direction Y, or any two adjacent first electrodes 21 in the direction of the angle bisector between the first direction X and the second direction Y.

For example, in a case where the connection channels F are provided between the portions of the diaphragm layer 3 located in the regions outside the working sub-regions A1 and the first electrode layer 2, orthogonal projections of the first connection electrodes 22 on the substrate 1 do not overlap with orthogonal projections of the connection channels F on the substrate 1.

In this way, it may avoid that the first connection electrodes 22, the portions of the diaphragm layer 3 corresponding to the connection channels F, and the second electrode layer 4 form capacitors, and avoid vibration generated by the portions of the diaphragm layer 3 corresponding to the connection channels F, which ensures the accuracy of the signal conversion, and ensures the transmitting and detection sensitivities of the transducer component 100 and the transducer 1000 to which the transducer component 100 is applied.

In this case, the second electrode layer 4 may be, for example, a planar electrode. Of course, the second electrode layer 4 may not be the planar electrode.

Figure 6:
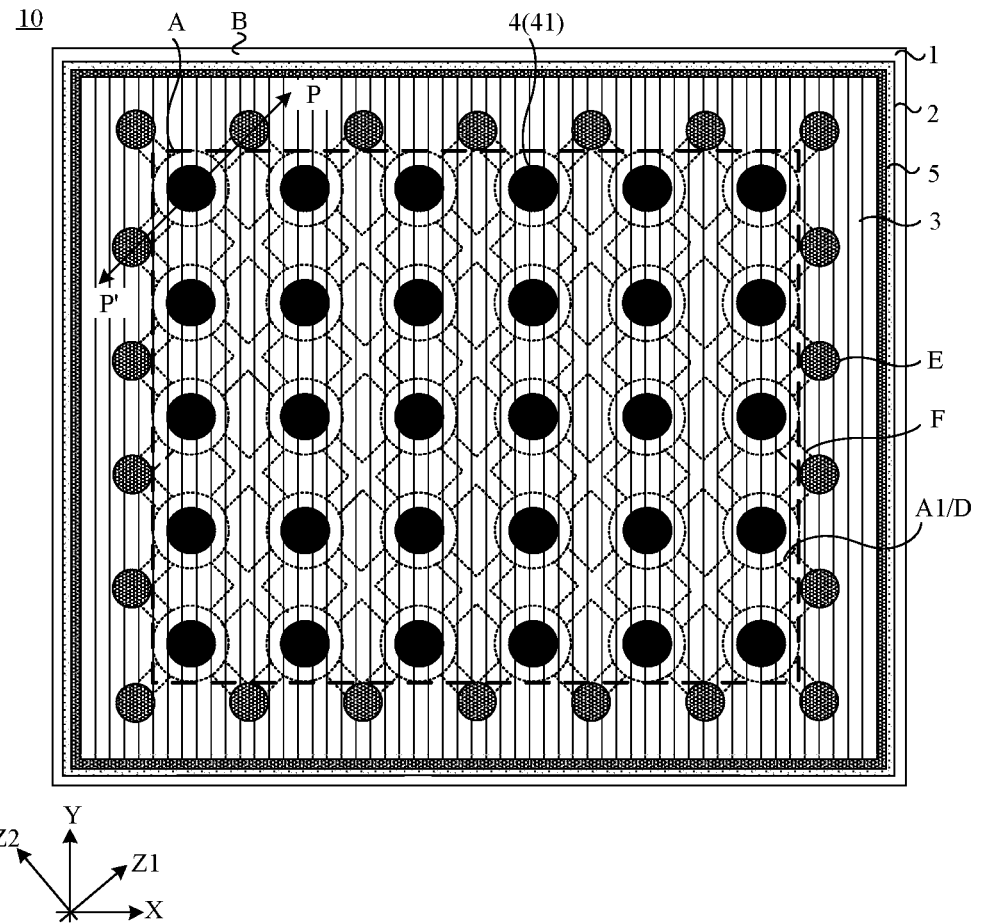
FIG. 6 is a diagram illustrating a structure of another array element, in accordance with some embodiments of the present disclosure.

In some other embodiments, as shown in FIG. 6, the second electrode layer 4 includes a plurality of second electrodes 41. A second electrode 41 is located in a working sub-region A1, and the second electrode 41 located in the working sub-region A1 is a portion of a cell C corresponding to the working sub-region A1.

In some examples, as shown in FIG. 2, in the case where the second electrode layer 4 includes the plurality of second electrodes 41, the second electrode layer 4 may further include a plurality of second connection electrodes 42. A second connection electrode 42 may connect two adjacent second electrodes 41, and the plurality of second electrodes 41 may be electrically connected together through the plurality of second connection electrodes 42.

Here, materials of the second connection electrode 42 and the second electrode 41 may be the same or different.

In these embodiments, since the plurality of second electrodes 41 are connected together through the second connection electrodes 42, instead of applying a voltage to each second electrode 41, the voltage can be applied to all second electrodes 41 by applying the voltage to one or several second electrodes 41, which may reduce the number of signal lines for inputting the voltage to the second electrodes 41, further simplify a structure of the transducer component 100.

The second electrodes 41 may be, for example, arranged in an array. In this case, the two adjacent second electrodes 41 may be any two adjacent second electrodes 41 in the first direction X, or any two adjacent second electrodes 41 in the second direction Y, or any two adjacent second electrodes 41 in the direction of the angle bisector between the first direction X and the second direction Y.

For example, as shown in FIG. 2, in a case where the connection channels F are provided between the portion of the diaphragm layer 3 located outside the working sub-regions A1 and the first electrode layer 2, orthogonal projections of the second connection electrodes 42 on the substrate 1 do not overlap with orthogonal projections of the connection channels F on the substrate 1.

In this way, it may avoid that the second connection electrodes 42, the portions of the diaphragm layer 3 corresponding to the connection channels F, and the first electrode layer 2 form capacitors, and further avoid the vibration generated by the portions of the diaphragm layer 3 corresponding to the connection channels F, which ensures the accuracy of the signal conversion, and ensures the transmitting and detection sensitivities of the transducer component 100 and the transducer 1000 to which the transducer component 100 is applied.

In this case, the first electrode layer 2 may be, for example, a planar electrode. Of course, the first electrode layer 2 may not be the planar electrode.

In yet other embodiments, as shown in FIG. 11, the first electrode layer 2 includes a plurality of first electrodes 21, and a first electrode 21 is located in a working sub-region A1. As shown in FIG. 2, the second electrode layer 4 includes a plurality of second electrodes 41, a second electrode 41 is located in a working sub-region A1.

Here, for the descriptions of the first electrode layer 2 and the second electrode layer 4, reference may be made to the descriptions in the above embodiments, which will not be repeated.

Figure 7:
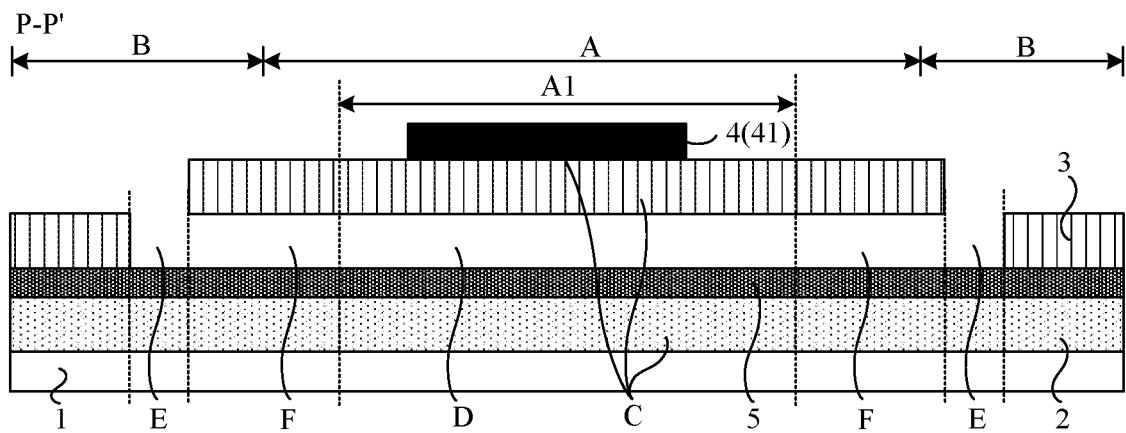
FIG. 7 is a sectional view illustrating the array element shown in FIG. 6 taken along the line P-P'.

In some embodiments, as shown in FIGS. 6 and 7, the array element 10 further includes an etch stop layer 5 disposed between the first electrode layer 2 and the diaphragm layer 3.

In some examples, at least one of the etch stop layer 5 and the diaphragm layer 3 is made of an insulating material.

Here, the diaphragm layer 3 and the etch stop layer 5 may both be made of the insulating material; or, the diaphragm layer 3 is made of the insulating material, and the etch stop 5 is made of a conductive material; or, the diaphragm layer 3 is made of a conductive material, and the etch stop layer 5 is made of the insulating material. The insulating material may be, for example, one of silicon oxide ($SiO_x$), silicon nitride ($SiN_x$), and silicon oxynitride ($SiN_xO_y$).

In some examples, as shown in FIGS. 6 and 7, orthogonal projections of the cavities D between the diaphragm layer 3 and the first electrode layer 2 and orthogonal projections of the release holes E of the diaphragm layer 3 on the substrate 1 are located within an orthogonal projection of the etch stop layer 5 on the substrate 1. For example, portions of the etch stop layer 5 are provided between the cavities D and the first electrode layer 2 in the direction perpendicular to the substrate 1, and the portions of the etch stop layer 5 are provided between the release holes E and the first electrode layer 2.

In a case where the connection channels F are provided between the portions of the diaphragm layer 3 located in the regions outside the working sub-regions A1 and the first electrode layer 2, the orthogonal projections of the connection channels F on the substrate 1 are also located within the orthogonal projection of the etch stop layer 5 on the substrate 1.

According to the steps of forming the diaphragm layer 3, in the embodiments of the present disclosure, the etch stop layer 5 is disposed between the first electrode layer 2 and the diaphragm layer 3, the etch stop layer 5 may be used to block etching gas or etching solution in processes of etching the diaphragm film to form the diaphragm layer 3 with the release holes E and removing the sacrificial layer 8, which prevents the etching gas or the etching solution from damaging the first electrode layer 2. In addition, a material of the diaphragm layer 3 and a material of the etch stop layer 5 may match each other (for example, in a case where the material of the diaphragm layer 3 is the conductive material, the material of the etch stop layer 5 is the insulating material), which ensures that the first electrode layer 2 and the second electrode layer 4 are insulated from each other, and increases selectivity of the material of the diaphragm layer 3.

It can be noted that in an actual application of the transducer component 100 or the transducer 1000 to which the transducer component 100 is applied, an environment in which the transducer component 100 or the transducer 1000 is located may be, for example, air, water or other media. In a case where the environment in which the transducer component 100 or the transducer 1000 is located is water or other liquid media, water or other liquid media may enter the cavities D located in the working sub-regions A1 through the release holes E of the diaphragm layer 3. In this way, the portions of the diaphragm layer 3 located in the working sub-regions A1 may not vibrate in the direction perpendicular to the substrate 1, or have a small vibration amplitude. As a result, the transmitting or receiving sensitivity of the array element 10 is affected, and further, the detection sensitivity of the transducer component 100 or the transducer 1000 is affected; here, the transducer 1000 may be an ultrasonic sensor.

Figure 8:
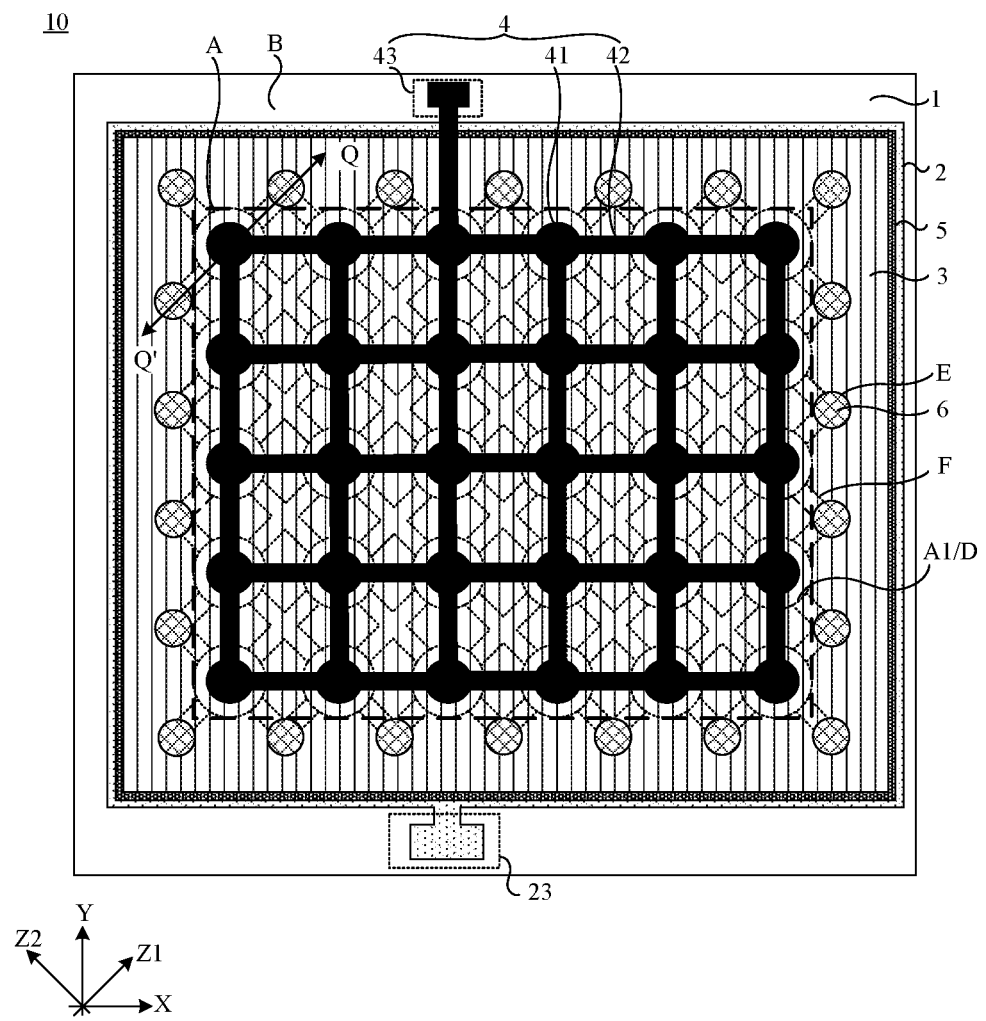
FIG. 8 is a diagram illustrating a structure of yet another array element, in accordance with some embodiments of the present disclosure.
Figure 9:
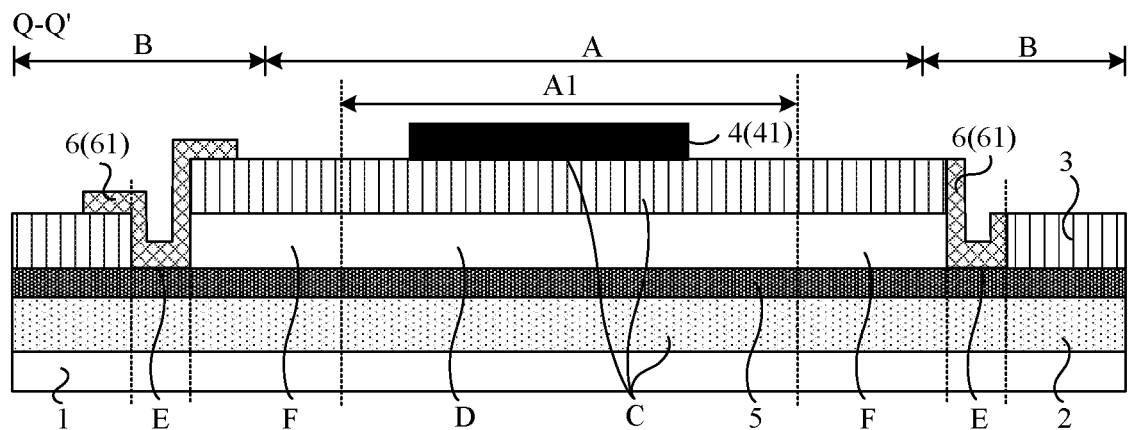
FIG. 9 is a sectional view illustrating the array element shown in FIG. 8 taken along the line Q-Q'.

Based on this, in some embodiments, as shown in FIGS. 8 and 9, the array element 10 further includes a filling layer 6 disposed on a side of the diaphragm layer 3 away from the substrate 1. The filling layer 6 includes a plurality of filling patterns 61. At least a portion of a filling pattern 61 is located in a release hole E, and an orthogonal projection of the release hole E on the substrate 1 coincides with an orthogonal projection of the filling pattern 61 on the substrate 1, or is located within the orthogonal projection of the filling pattern 61 on the substrate 1.

In some examples, as shown in FIG. 9, in a case where the whole filling pattern 61 is located in a corresponding release hole E, the orthogonal projection of the filling pattern 61 on the substrate 1 coincides with the orthogonal projection of the corresponding release hole E on the substrate 1.

In some other examples, as shown in FIG. 9, in a case where a portion of the filling pattern 61 is located in a corresponding release hole E, another portion of the filling pattern 61 may be located on a surface of the diaphragm layer 3 away from the substrate 1 and at an edge of the corresponding release hole E. In this case, the orthogonal projection of the release hole E on the substrate 1 is located within the orthogonal projection of the filling pattern 61 on the substrate 1.

In the embodiments of the present disclosure, by providing the filling layer 6 including the plurality of filling patterns 61 to fill the plurality of release holes E of the diaphragm layer 3, it is possible to prevent the cavities D from communicating with outside through the release holes E. Therefore, the water or other liquid media may not enter the cavities D located in the working sub-regions A1 through the release holes E of the diaphragm layer 3 in a case where the transducer component 100 or the transducer 1000 is located in the environment of water or other liquid media, which avoids an influence on the detection sensitivity of the transducer component 100 or the transducer 1000. In this case, the transducer 1000 may be the ultrasonic sensor.

A material of the filling layer 6 is not limited in the present disclosure. For example, the material of the filling layer 6 may include, for example, at least one of silicon nitride, silicon oxide or silicon oxynitride.

Based on this, in the embodiments of the present disclosure, the release holes E of the diaphragm layer 3 are only located in the peripheral region B of the array element 10, so that the filling layer 6 only needs to be arranged in the peripheral region B of the array element 10 to fill the release holes E in the diaphragm layer 3. In this way, the number of release holes E in the embodiments of the present disclosure is small, and the number of filling patterns 61 that need to be provided is reduced, which is beneficial to reducing a difficulty of filling the release holes E, and is further beneficial to simplifying a manufacturing process of the transducer component 100.

Figure 10:
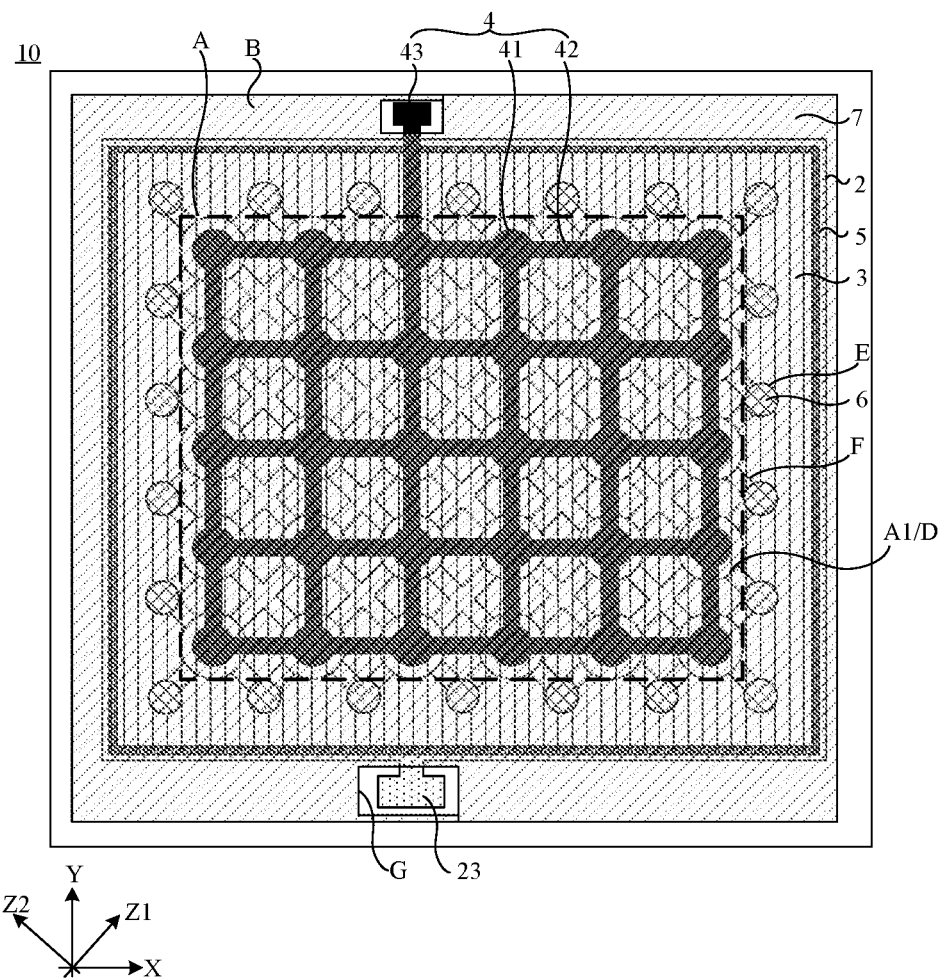
FIG. 10 is a diagram illustrating a structure of yet another array element, in accordance with some embodiments of the present disclosure.

In some embodiments, as shown in FIG. 10, the array element 10 further includes a passivation (PVX) layer 7 disposed on a side of the second electrode layer 4 away from the substrate 1. The passivation layer 7 has a plurality of openings G.

In some examples, as shown in FIG. 10, the first electrode layer 2 includes at least one first connection pad 23, and the second electrode layer 4 includes at least one second connection pad 43. The first connection pad 23 and the second connection pad 43 are each configured to be electrically connected to a corresponding signal line to receive a corresponding voltage signal.

In some examples, as shown in FIG. 10, the plurality of openings G in the passivation layer 7 expose the at least one first connection pad 23 and the at least one second connection pad 43. That is, a sum of the number of first connection pads 23 and the number of second connection pads 43 is equal to the number of openings G.

In this way, the passivation layer 7 covers the second electrode layer 4, the diaphragm layer 3, and the first electrode layer 2, and only exposes the first connection pad(s) 23 and the second connection pad(s) 43.

In the embodiments of the present disclosure, by providing the passivation layer 7 on the side of the second electrode layer 4 away from the substrate 1, the passivation layer 7 may be used to protect the array element 10, so as to prevent the first electrode layer 2, the etch stop layer 5, the diaphragm layer 3, the second electrode layer 4 and other structures from being damaged, and avoid an influence on a normal detection of the transducer component 100 or the transducer 1000. In this case, the transducer 1000 may be the ultrasonic sensor.

Based on this, by providing the plurality of openings G in the passivation layer 7 to expose the first connection pad(s) 23 and the second connection pad(s) 43, it is convenient for the first connection pad 23 and the second connection pad 43 to be electrically connected to corresponding signal lines, so as to provide corresponding voltage signals to the first electrode layer 2 and the second electrode layer 4.

For example, the orthogonal projection of the diaphragm layer 3 on the substrate 1 does not overlap with orthogonal projection(s) of the at least one first connection pad on the substrate 1. In this way, even if an area of the diaphragm layer 3 is relatively large, it is also possible to prevent the diaphragm layer 3 from covering the at least one first connection pad 23, and further, it is possible to avoid influence on electrical connection between the at least one first connection pad 23 and corresponding signal line(s).

For example, in a case where the array element 10 further includes the etch stop layer 5, the orthogonal projection of the etch stop layer 5 on the substrate 1 does not overlap with the orthogonal projection(s) of the at least one first connection pad 23 on the substrate 1. In this way, even if an area of the etch stop layer 5 is relatively large, it is also possible to prevent the etch stop layer 5 from covering the at least one first connection pad 23, and further, it is possible to avoid the influence on the electrical connection between the at least one first connection pad 23 and the corresponding signal line(s).

Some embodiments of the present disclosure further provide a manufacturing method of a transducer component, which may be used for manufacturing the above transducer component 100. The manufacturing method includes manufacturing a plurality of array elements 10.

Figure 16:
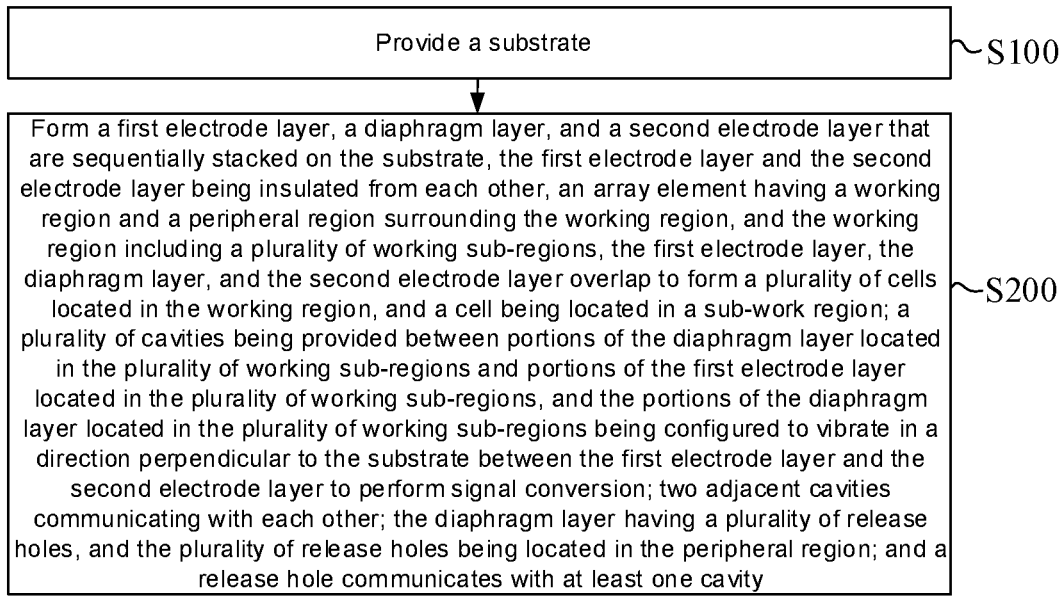
FIG. 16 is a flow diagram illustrating a manufacturing method of an array element, in accordance with some embodiments of the present disclosure.

In some examples, as shown in FIG. 16, manufacturing an array element 10 of the plurality of array elements 10 includes steps 100 and 200 (S100 and S200).

In S100, a substrate 1 is provided.

For the description of a structure of the substrate 1, reference can be made to the description in some examples described above, and details will not be repeated here.

In S200, a first electrode layer 2, a diaphragm layer 3, and a second electrode layer 4 that are sequentially stacked are formed on the substrate 1. The first electrode layer 2 and the second electrode layer 4 are insulated from each other. The array element 10 has a working region A and a peripheral region B surrounding the working region A. The working region A includes a plurality of working sub-regions A1. The first electrode layer 2, the diaphragm layer 3, and the second electrode layer 4 overlap to form a plurality of cells C located in the working region A, and a cell C is located in a working sub-region A1. A plurality of cavities D are provided between portions of the diaphragm layer 3 located in the plurality of working sub-regions A1 and portions of the first electrode layer 2 located in the plurality of working sub-regions A1, and the portions of the diaphragm layer 3 located in the plurality of working sub-regions A1 may vibrate in a direction perpendicular to the substrate 1 (i.e., a thickness direction of the substrate 1) between the first electrode layer 2 and the second electrode layer 4 to perform signal conversion. Two adjacent cavities D communicate with each other. The diaphragm layer 3 has a plurality of release holes E, the plurality of release holes E are located in the peripheral region B, and a release hole E communicates with at least one cavity D.

Here, materials, shapes, and structures of the first electrode layer 2, the diaphragm layer 3, and the second electrode layer 4 are not limited, reference can be made to the above embodiments, and details will not be repeated here.

It can be noted that in a process of manufacturing the transducer component 100, the plurality of array elements 10 may be simultaneously formed.

Beneficial effects that can be achieved by the manufacturing method of the transducer component provided in some embodiments of the present disclosure are the same as the beneficial effects that can be achieved by the transducer component 100 provided in some embodiments described above, which will not be repeated herein.

A method of forming the first electrode layer 2, the diaphragm layer 3, and the second electrode layer 4 that are sequentially stacked on the substrate 1 in S200 may be various, which may be selected according to actual needs.

Figure 17:
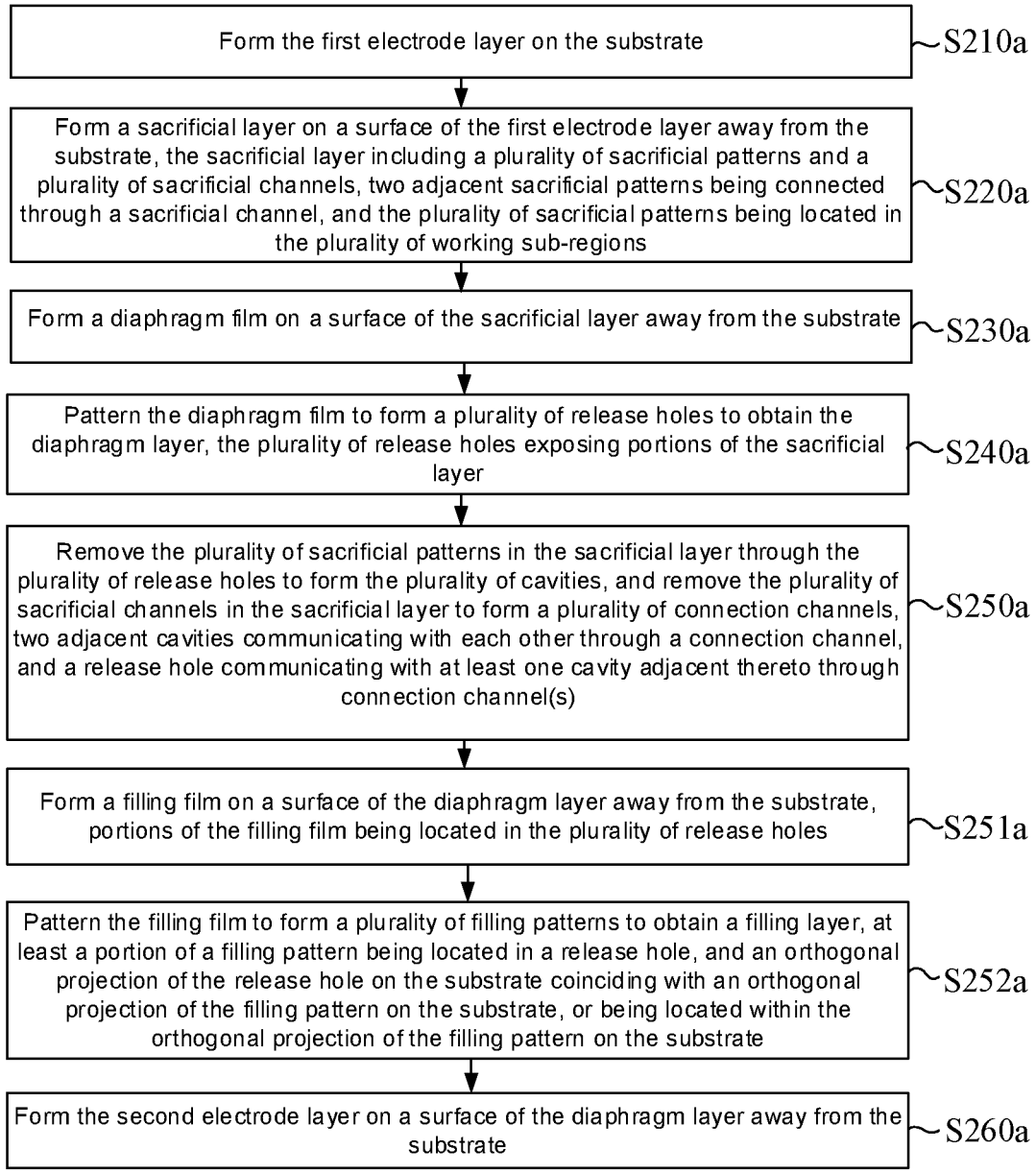
FIG. 17 is a flow diagram illustrating step 200 (S200) in the manufacturing method shown in FIG. 16.

In some embodiments, as shown in FIG. 17, forming the first electrode layer 2, the diaphragm layer 3, and the second electrode layer 4 that are sequentially stacked on the substrate 1 in S200 includes steps 210a to 260a (S210a to S260a).

Figure 20A:
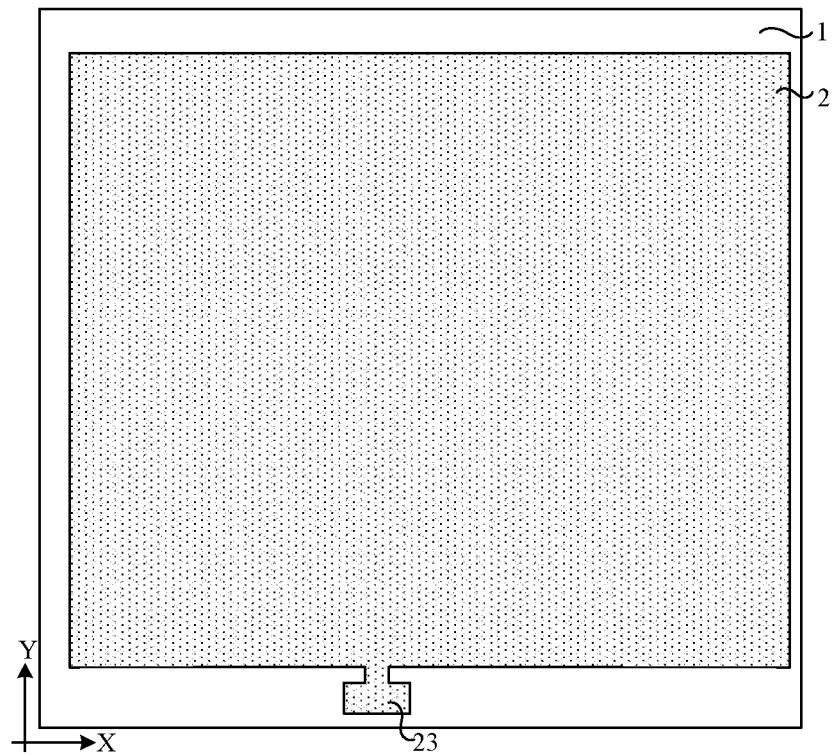
FIGS. 20A to 20L are diagrams illustrating processes of forming an array element, in accordance with some embodiments of the present disclosure.

In S210a, as shown in FIG. 20A, the first electrode layer 2 is formed on the substrate 1.

FIG. 20A shows a process of forming the first electrode layer 2 by taking an example in which the first electrode layer 2 is a planar electrode.

For example, a method for forming the first electrode layer 2 may be: depositing a first conductive film on the substrate 1, and then patterning the first conductive film to form the first electrode layer 2.

Here, a patterning process may include, for example, photoresist coating, mask exposure, development and etching processes.

Figure 20B:
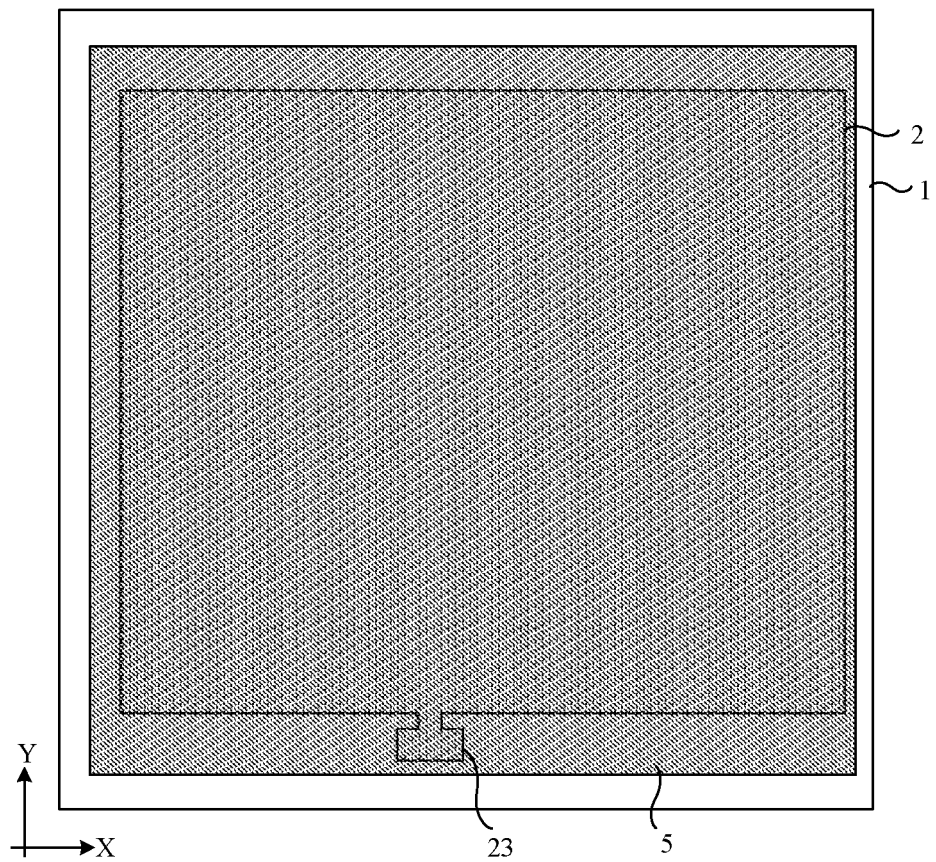
Figure 20C:
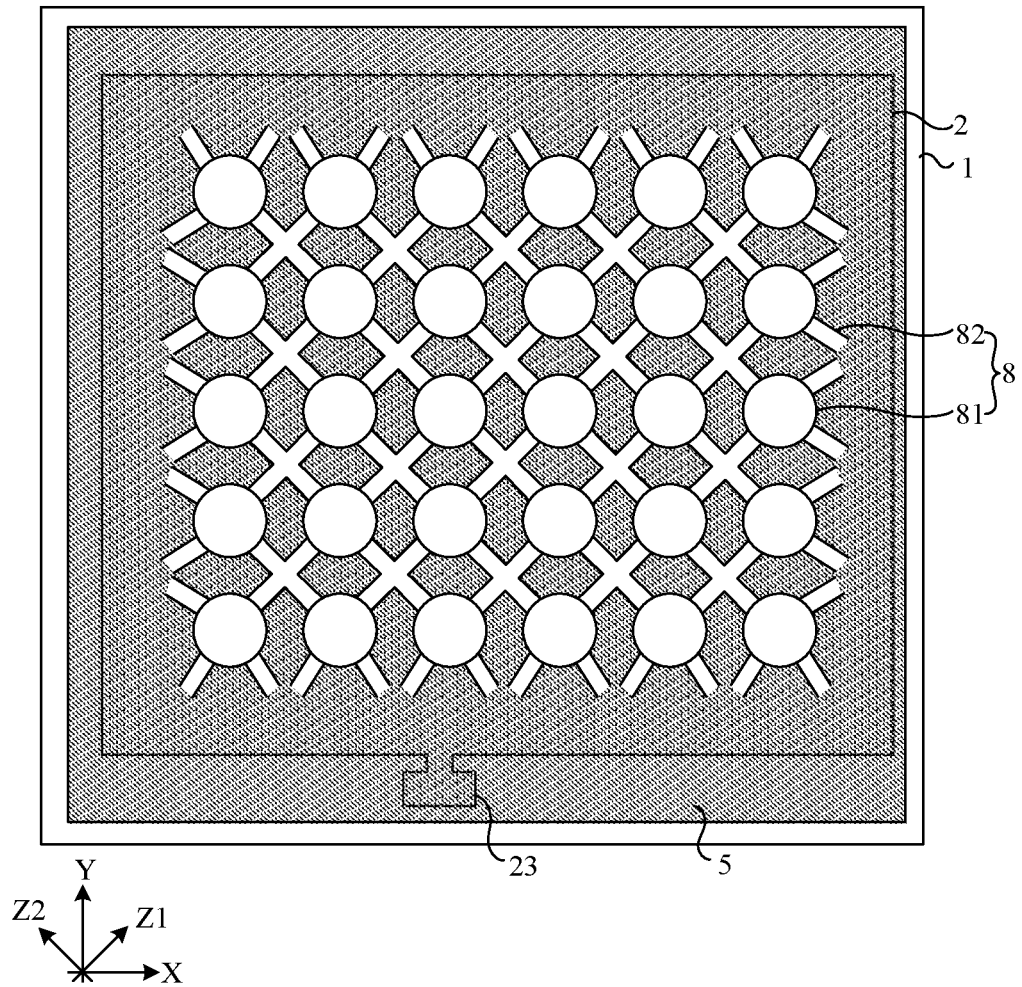

In S220a, as shown in FIG. 20C, a sacrificial layer 8 is formed on a surface of the first electrode layer 2 away from the substrate 1. The sacrificial layer 8 includes a plurality of sacrificial patterns 81 and a plurality of sacrificial channels 82. Two adjacent sacrificial patterns 81 are connected through a sacrificial channel 82. The plurality of sacrificial patterns 81 are located in the plurality of working sub-regions A1.

Here, a material of the sacrificial layer 8 is not limited in the present disclosure. For example, the material of the sacrificial layer 8 may be, for example, a photoresist, a metal, an insulating material, or a semiconductor material.

For example, a method for forming the sacrificial layer 8 may be: forming a sacrificial film on the surface of the first electrode layer 2 away from the substrate 1, and then patterning the sacrificial film to form the sacrificial layer 8.

Here, in a case where the material of the sacrificial layer 8 is the photoresist, a patterning process includes mask exposure and development processes. In a case where the material of the sacrificial layer 8 is the metal, the insulating material or the semiconductor material, a patterning process includes: photoresist coating, mask exposure, development and etching processes.

A connection manner between the sacrificial channels 82 and the sacrificial patterns 81 is not limited in the present disclosure, as long as the sacrificial patterns 81 can be connected together through the sacrificial channels 82.

For example, the plurality of sacrificial patterns 81 are arranged in an array. The plurality of sacrificial patterns 81 are arranged in rows in a first direction X and in columns in a second direction Y.

Figure 23:
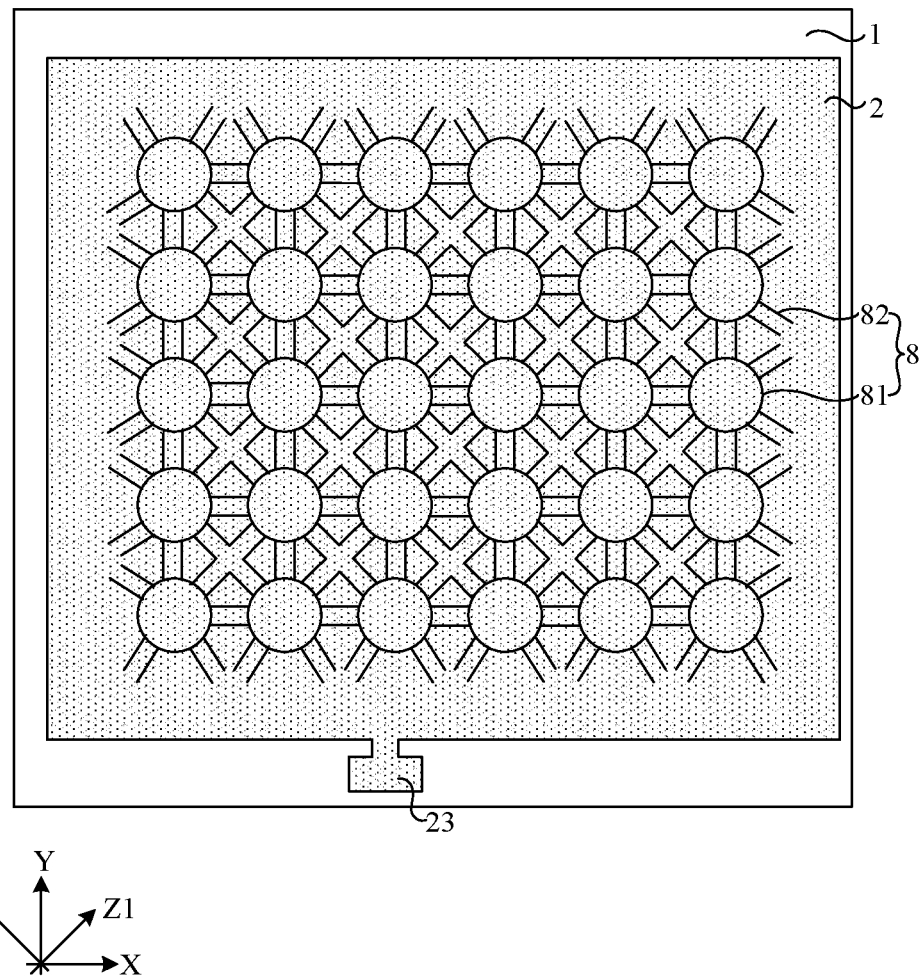
FIG. 23 is a schematic diagram illustrating another process of forming a sacrificial layer on a first electrode layer, in accordance with some embodiments of the present disclosure.

For example, as shown in FIG. 23, in the first direction X, any two adjacent sacrificial patterns 81 in sacrificial patterns 81 in each row are connected together through a sacrificial channel 82; in the second direction Y, any two adjacent sacrificial patterns 81 in sacrificial patterns 81 in each column are connected together through a sacrificial channel 82; and in a third direction Z1, any two adjacent sacrificial patterns 81 in sacrificial patterns 81 are connected together through a sacrificial channel 82, and in a fourth direction Z2, any two adjacent sacrificial patterns 81 in sacrificial patterns 81 are connected together through a sacrificial channel 82. The third direction Z1 is a direction of an angle bisector between the first direction X and the second direction Y, and the fourth direction Z2 is perpendicular to the third direction Z1.

For another example, as shown in FIG. 20C, in the third direction Z1, any two adjacent sacrificial patterns 81 in sacrificial patterns 81 are connected together through a sacrificial channel 82; and in the fourth direction Z2, any two adjacent sacrificial patterns 81 in sacrificial patterns 81 are connected together through a sacrificial channel 82.

Figure 22:
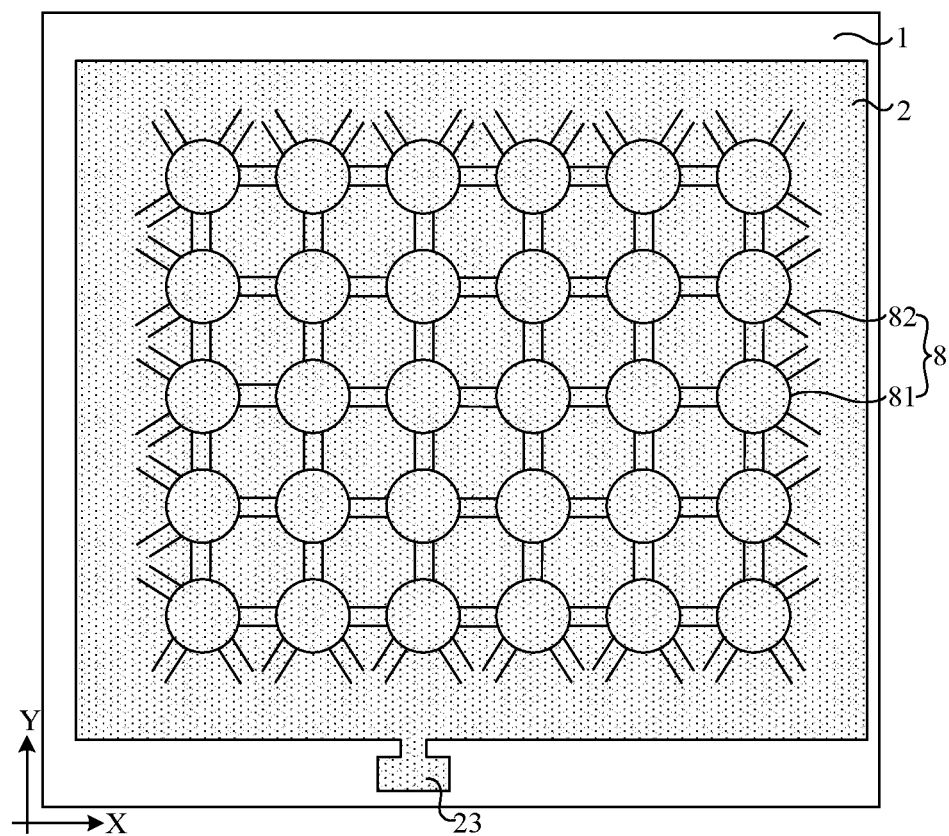
FIG. 22 is a schematic diagram illustrating a process of forming a sacrificial layer on a first electrode layer, in accordance with some embodiments of the present disclosure.

For yet another example, as shown in FIG. 22, any two adjacent sacrificial patterns 81 in sacrificial patterns 81 in each row in the first direction X are connected together through a sacrificial channel 82; and any two adjacent sacrificial patterns 81 in sacrificial patterns 81 in each column in the second direction Y are connected together through a sacrificial channel 82.

Figure 20D:
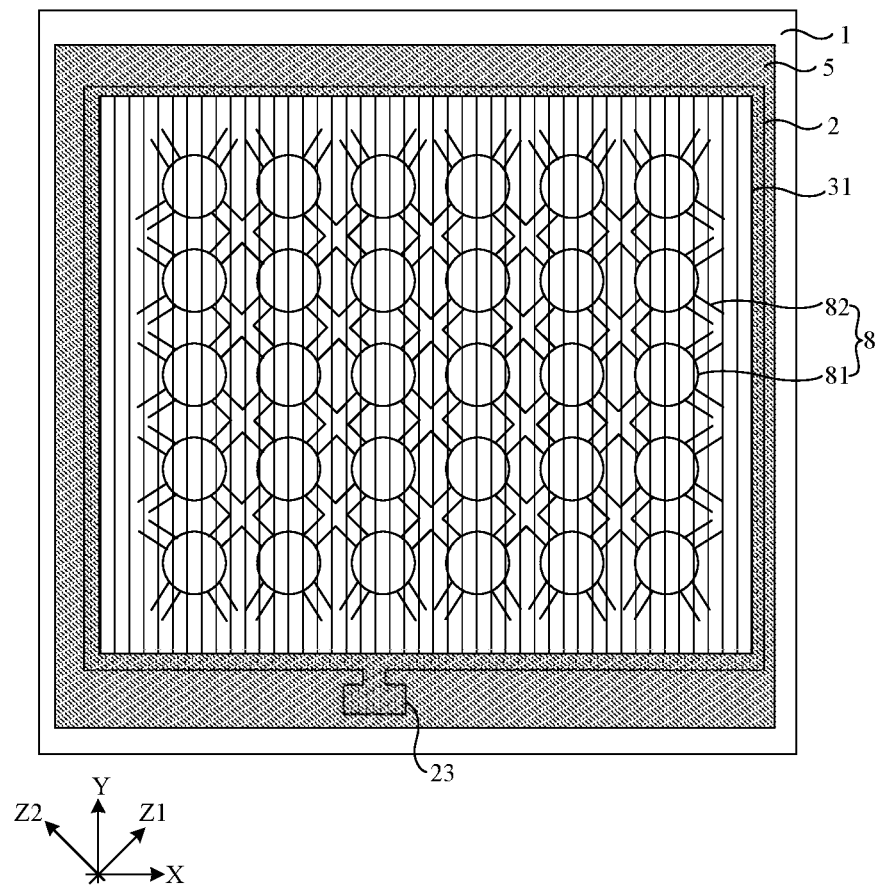

In S230a, as shown in FIG. 20D, a diaphragm film 31 is formed on a surface of the sacrificial layer 8 away from the substrate 1.

For example, the diaphragm film 31 may be formed by using a deposition process.

A material of the diaphragm film 31 may be, for example, an insulating material. The insulating material may be one of silicon oxide, silicon nitride, and silicon oxynitride.

Figure 20E:
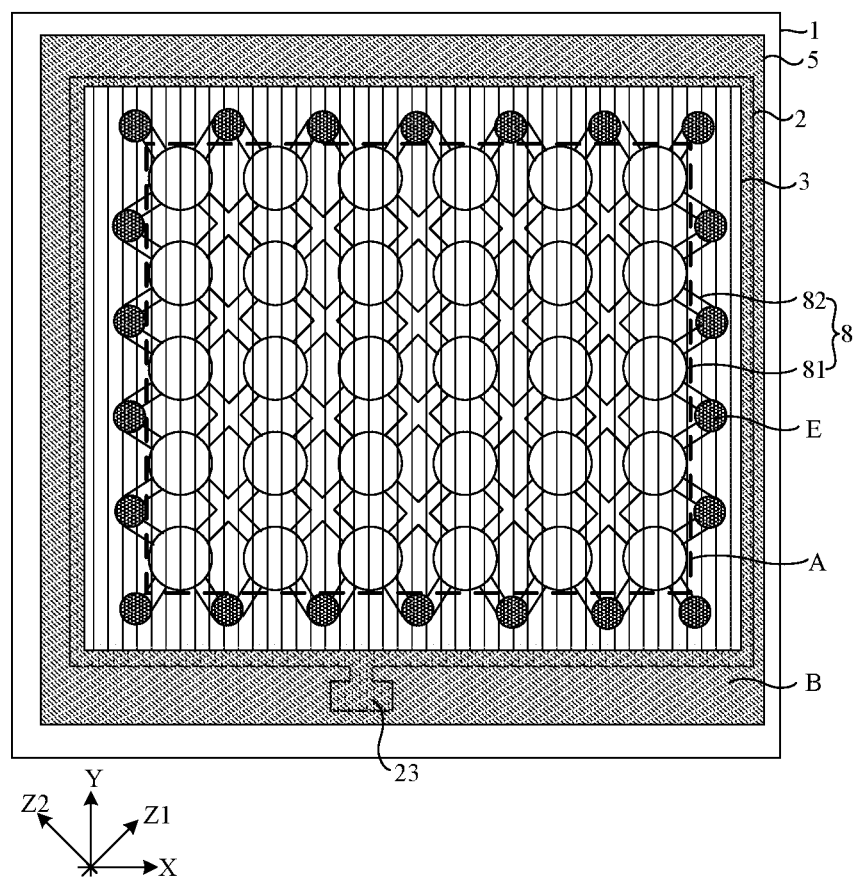

In S240a, as shown in FIG. 20E, the diaphragm film 31 is patterned to form a plurality of release holes E, so as to obtain the diaphragm layer 3. The plurality of release holes E expose portions of the sacrificial layer 8.

For example, a patterning process includes photoresist coating, mask exposure, development and etching processes.

Orthogonal projections of the plurality of release holes E on the substrate 1 are located within an orthogonal projection of the sacrificial layer 8 on the substrate 1. After the plurality of release holes E are formed, the plurality of release holes E may expose surfaces, away from the substrate 1, of the portions of the sacrificial layer 8 that corresponds to the plurality of release holes E.

Figure 20F:
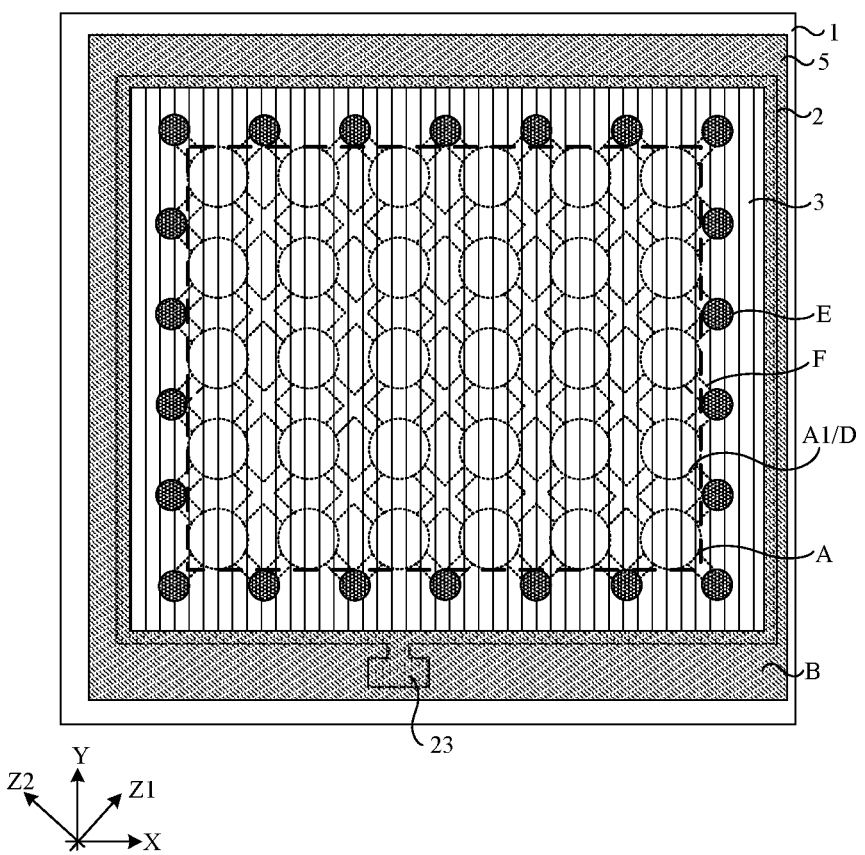

In S250a, as shown in FIG. 20F, the plurality of sacrificial patterns 81 in the sacrificial layer 8 are removed through the plurality of release holes E to form the plurality of cavities D, and the plurality of sacrificial channels 82 in the sacrificial layer 8 are removed through the plurality of release holes E to form a plurality of connection channels F. Two adjacent cavities D communicate with each other through a connection channel F, and a release hole E communicates with at least one cavity D adjacent thereto through connection channel(s) F.

For example, the sacrificial patterns 81 and the sacrificial channels 82 may be removed by a wet etching process or a dry etching process.

It will be understood that, although the sacrificial patterns 81 and the sacrificial channels 82 are located between the substrate 1 and the diaphragm layer 3, the release holes E in the diaphragm layer 3 expose the portions of the sacrificial layer 8, so that in a process of removing the sacrificial layer 8 by the wet etching process or the dry etching process, etching solution or etching gas may be in contact with the portions of the sacrificial layer 8 through the release holes E to remove the portions of the sacrificial layer 8, and then the etching solution or etching gas may enter between the substrate 1 and the diaphragm layer 3 through the release holes E to remove the sacrificial channels 82 and the sacrificial patterns 81. In this way, all the sacrificial patterns 81 and sacrificial channels 82 in the sacrificial layer 8 may be removed to form the cavities D and the connection channels F.

It can be noted that, in a case where the sacrificial patterns 81 and the sacrificial channels 82 in the sacrificial layer 8 are removed by the wet etching process or the dry etching process, a release of the sacrificial layer 8 by the wet etching or dry etching may be made isotropic. In this way, it is possible to remove all the sacrificial patterns 81 and sacrificial channels 82 in the sacrificial layer 8, and ensure a fast removal speed.

For example, in a process of releasing the sacrificial layer 8, concentration of the etching solution or concentration of the etching gas may be adjusted (e.g., appropriately increased), a release temperature may be adjusted (e.g., appropriately increased), which may optimize process parameters, so that total time for releasing the sacrificial layer 8 in the embodiments of the present disclosure does not significantly increase compared with that in the above implementation.

A person skilled in the art should understand that in the process of removing the sacrificial patterns 81 and the sacrificial channels 82, there is a need to ensure that the first electrode layer 2 and the diaphragm layer 3 are not corroded or corroded at an extremely slow rate. Based on this, it can be understood that the first electrode layer 2, the sacrificial layer 8, and the diaphragm layer 3 are not made of the same material.

In addition, the sacrificial patterns 81 and the sacrificial channels 82 are removed, so that the sacrificial layer 8 is released.

It can be understood that after the sacrificial patterns 81 and the sacrificial channels 82 between the first electrode layer 2 and the diaphragm layer 3 are removed, the cavities D are formed between portions of the diaphragm layer 3 corresponding to the sacrificial patterns 81 and the first electrode layer 2, and the connection channels F are formed between portions of the diaphragm layer 3 corresponding to the sacrificial channels 82 and the first electrode layer 2. The connection channels F communicate the release holes E located in the peripheral region B with the cavities D located in the working sub-regions A1, and adjacent cavities D communicate through connection channels F.

Figure 20G:
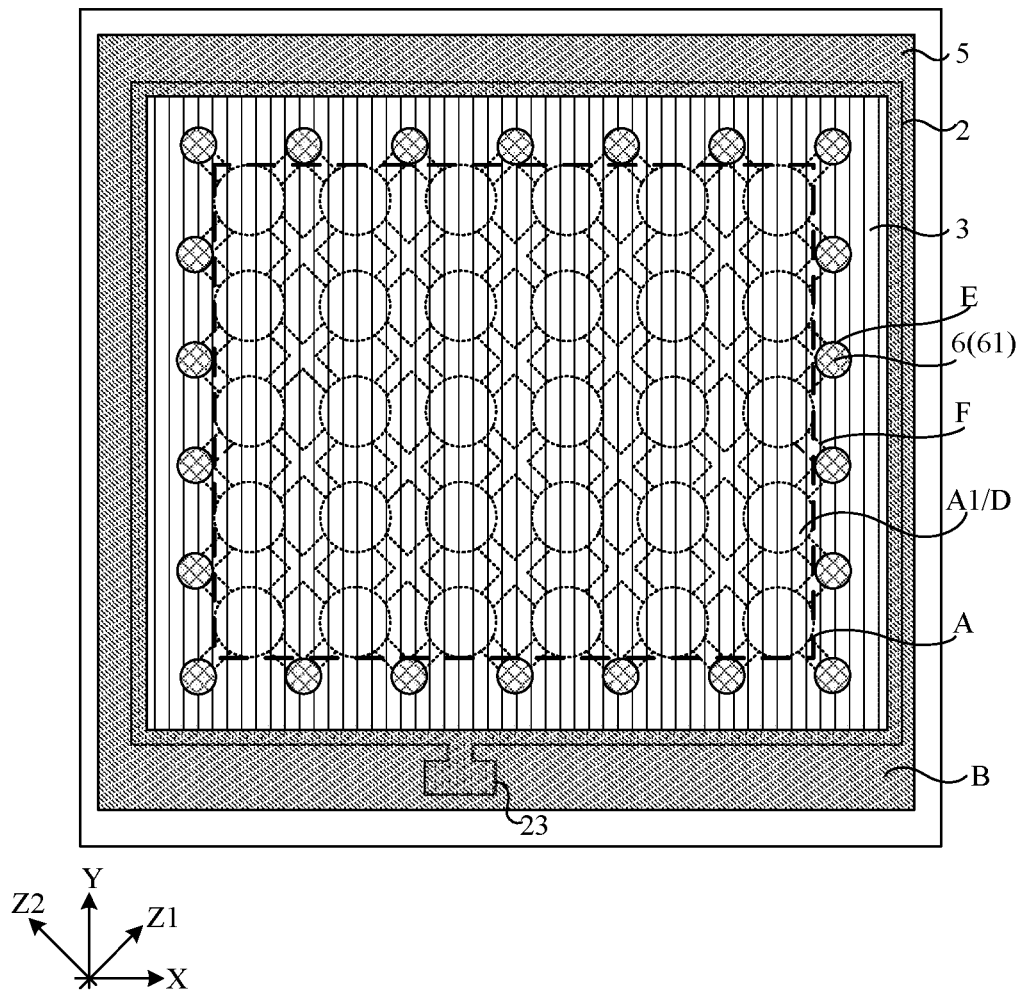
Figure 20H:
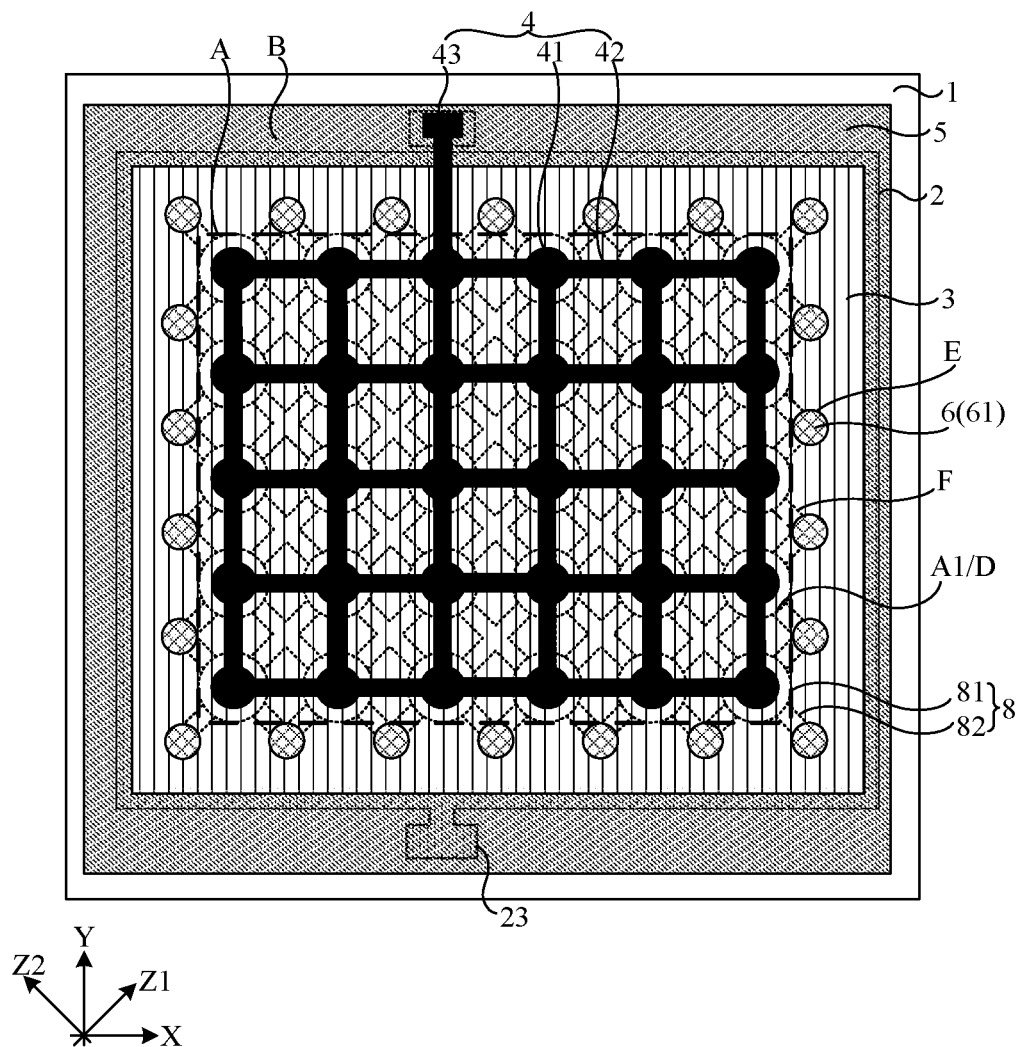

In S260a, as shown in FIG. 20H, the second electrode layer 4 is formed on a surface of the diaphragm layer 3 away from the substrate 1.

For example, for a process of forming the second electrode layer 4, reference may be made to a process of forming the first electrode layer 2, which will not be repeated here.

In some examples, as shown in FIG. 17, the manufacturing method of the transducer component further includes steps 251a and 252a (S251a and S252a) after S250a and before S260a.

Figure 20I:
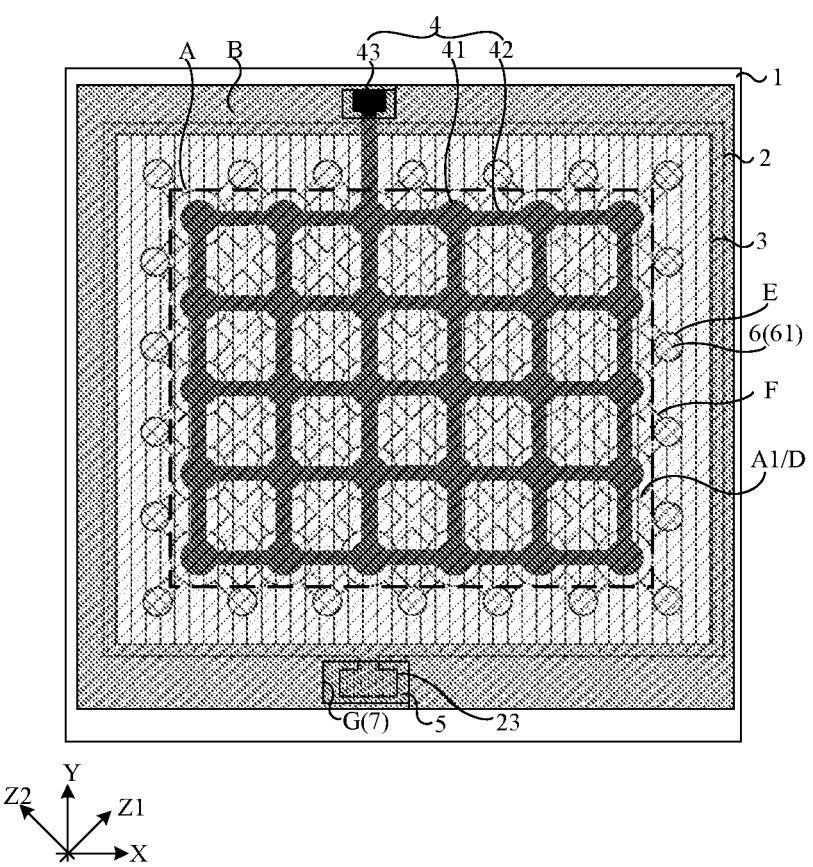
Figure 20J:
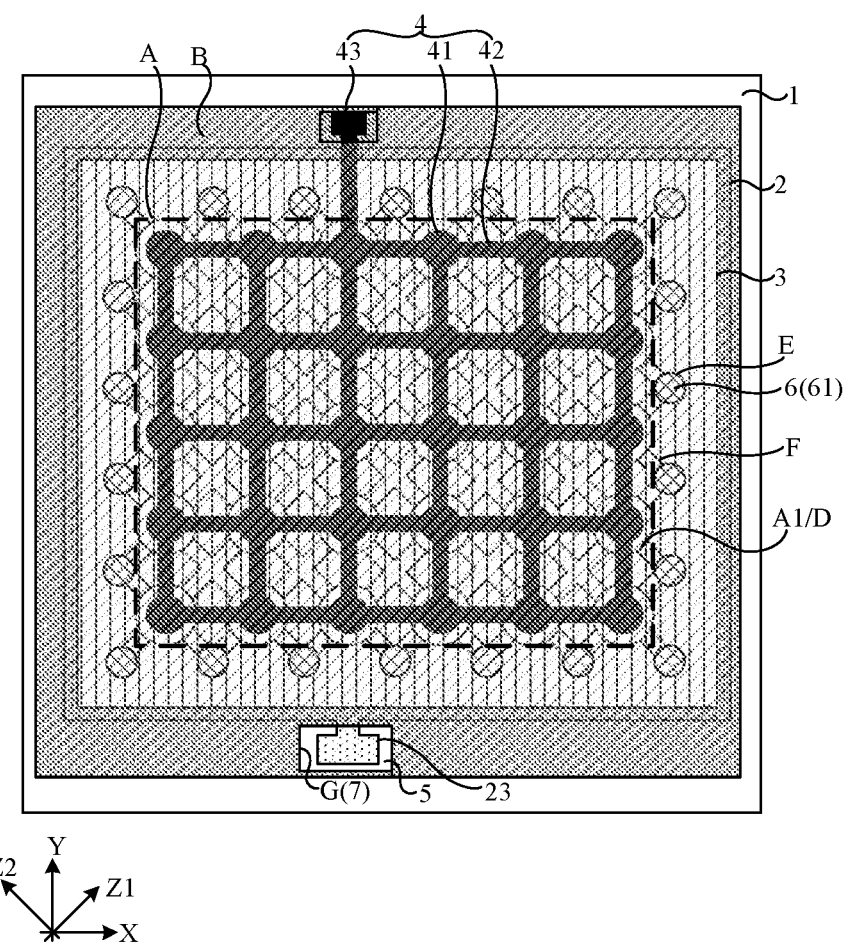
Figure 20K:
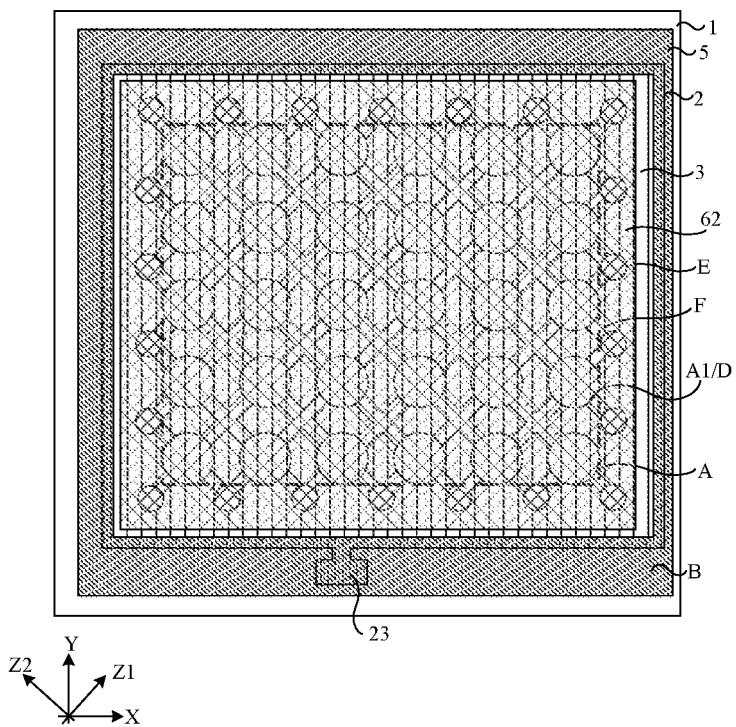

In S251a, as shown in FIG. 20K, a filling film 62 is formed on the surface of the diaphragm layer 3 away from the substrate 1, and portions of the filling film 62 are located in the plurality of release holes E.

For example, the filling film may be formed by using a deposition process.

A material for forming the filling film is not limited here, and reference may be made to the above embodiments, which will not be repeated herein.

In a process of forming the filling film, the material for forming the filling film may be naturally filled in the plurality of release holes E, so that the portions of the formed filling film is located in the plurality of release holes E.

In S252a, as shown in FIG. 20G, the filling film 62 is patterned to form a plurality of filling patterns 61, so as to obtain a filling layer 6. At least a portion of a filling pattern 61 is located in a release hole E, and an orthogonal projection of the release hole E on the substrate 1 coincides with an orthogonal projection of the filling pattern 61 on the substrate 1, or the orthogonal projection of the release hole E on the substrate 1 is located within the orthogonal projection of the filling pattern 61 on the substrate 1.

For example, a patterning process includes photoresist coating, mask exposure, development and etching processes.

In a process of patterning the filling film, a portion of the filling film located on the surface of the diaphragm layer 3 away from the substrate 1 may be completely removed, and only the portions of the filling film located in the release holes E are remained. In this case, an orthogonal projection of the filling pattern 61 on the substrate 1 coincides with an orthogonal projection of a corresponding release hole E on the substrate 1.

Of course, in a process of patterning the filling film, it may also be that portions of the filling film located at edges of the release holes E and on the surface of the diaphragm layer 3 away from the substrate 1 are remained on a basis of remaining the portions of the filling film located in the release holes E. In this case, the orthogonal projection of the release hole E on the substrate 1 is located within the orthogonal projection of a corresponding filling pattern 61 on the substrate 1.

In the embodiments of the present disclosure, since at least the portion of the filling pattern 61 is located in the release hole E of the diaphragm layer 3, it is possible to prevent water or other liquid media from entering the cavities D between the diaphragm layer 3 and the first electrode layer 2 through the release holes E of the diaphragm layer 3 in a case where the transducer component 100 and the transducer 1000 to which the transducer component 100 is applied are located in the environment of water or other liquid media in an actual application, and avoid an influence on detection sensitivities of the transducer component 100 and the transducer 1000 (the transducer 1000 may be an ultrasonic sensor) to which the transducer component 100 is applied.

Based on this, in the embodiments of the present disclosure, the plurality of release holes E of the diaphragm layer 3 are only located in the peripheral region B of the array element 10, so that the filling layer 6 only needs to be arranged in the peripheral region B of the array element 10 to fill the release holes E in the diaphragm layer 3. In this way, the number of release holes E in the embodiments of the present disclosure is small, and the number of filling patterns 61 that need to be provided is reduced, which is beneficial to reducing a difficulty of filling the release holes E, and is further beneficial to simplifying a manufacturing process of the transducer component 100.

Figure 18:
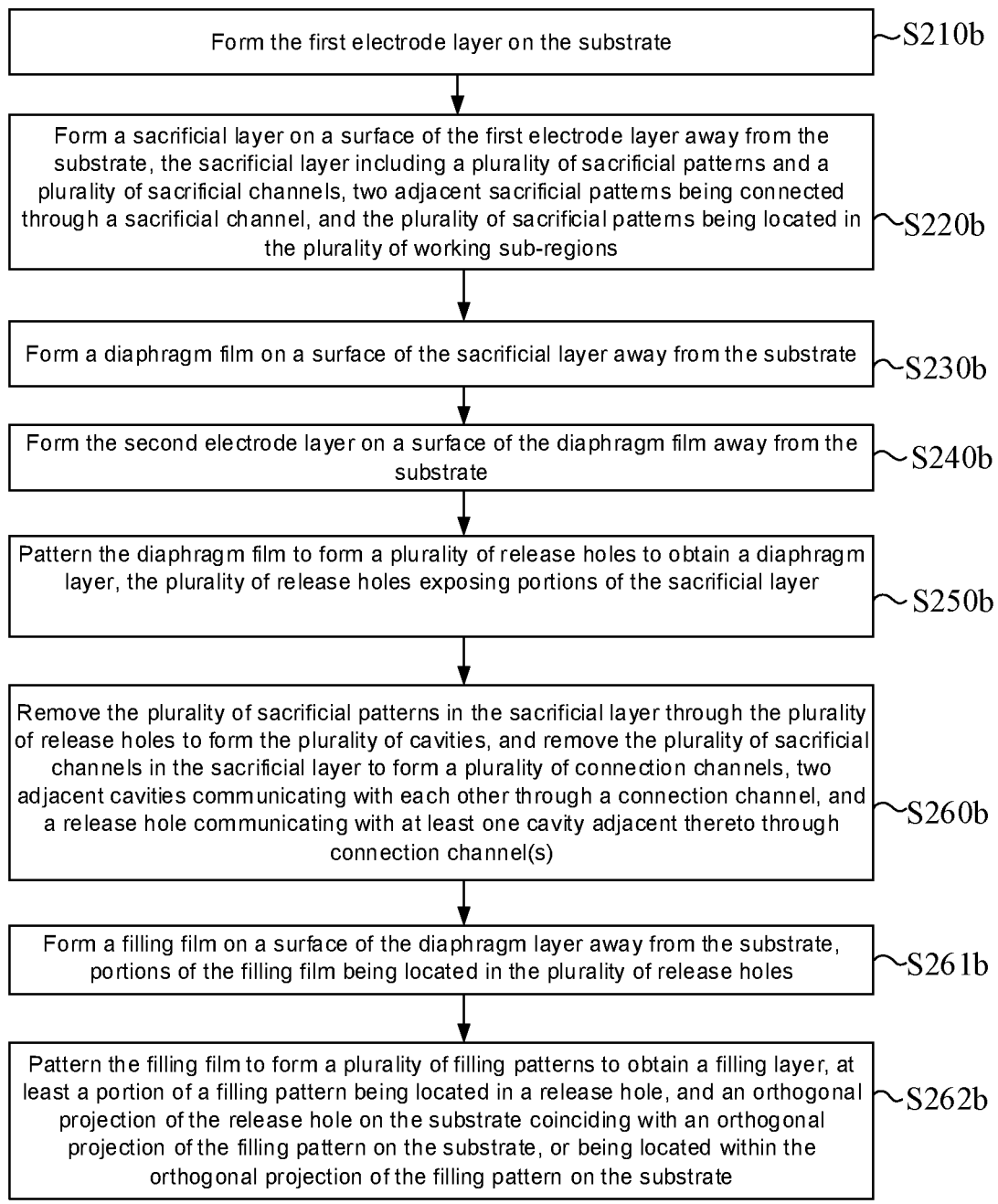
FIG. 18 is another flow diagram illustrating step 200 (S200) in the manufacturing method shown in FIG. 16.

In some other embodiments, as shown in FIG. 18, forming the first electrode layer 2, the diaphragm layer 3, and the second electrode layer 4 that are sequentially stacked on the substrate 1 in S200 includes steps 210b to 260b (S210b to S260b).

In S210b, as shown in FIG. 20A, the first electrode layer 2 is formed on the substrate 1.

For example, a method of forming the first electrode layer 2 in S210b may be the same as the method of forming the first electrode layer 2 in S210a, which will not be repeated here.

In S220b, as shown in FIG. 20C, a sacrificial layer 8 is formed on a surface of the first electrode layer 2 away from the substrate 1. The sacrificial layer 8 includes a plurality of sacrificial patterns 81 and a plurality of sacrificial channels 82. Two adjacent sacrificial patterns 81 are connected through a sacrificial channel 82. The plurality of sacrificial patterns 81 are located in the plurality of working sub-regions A1.

For example, a method of forming the sacrificial layer 8 in S220b may be the same as the method of forming the sacrificial layer 8 in S220a. A connection manner between the sacrificial channels 81 and the sacrificial channels 82 in S220b are the same as the connection manner between the sacrificial patterns 81 and the sacrificial channels 82 in S220a, which will not be repeated here.

In S230b, as shown in FIG. 20D, a diaphragm film 31 is formed on a surface of the sacrificial layer 8 away from the substrate 1.

For example, a method of forming the diaphragm film 31 in S230b may be the same as the method of forming the diaphragm film 31 in S230a, which will not be repeated here.

Figure 21A:
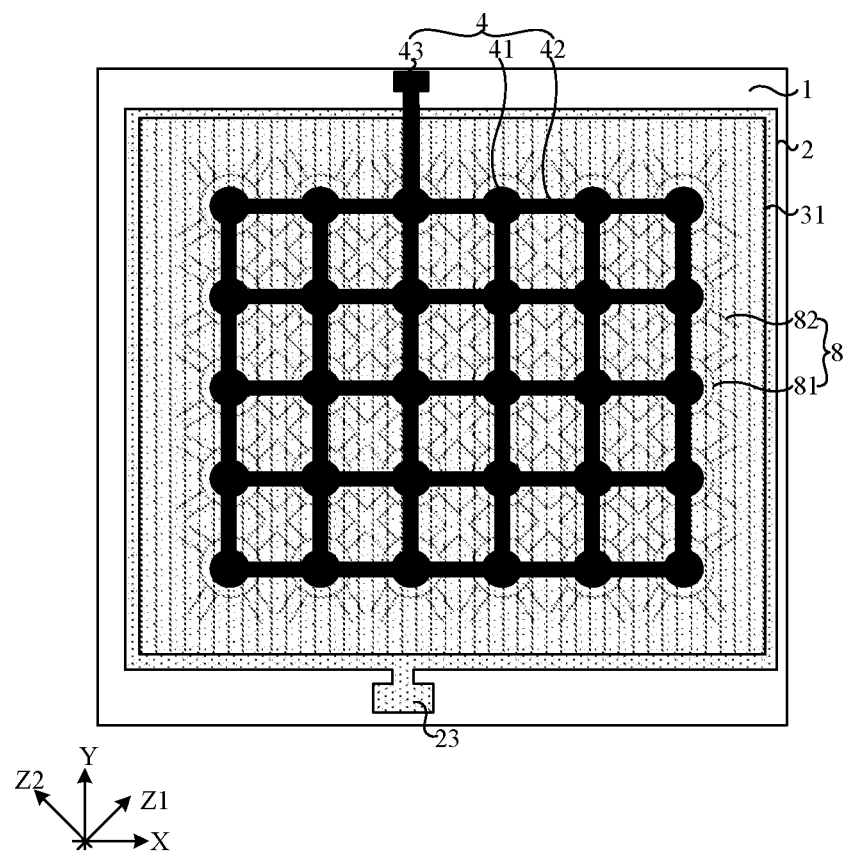
FIGS. 21A to 21C are diagrams illustrating processes of forming another array element, in accordance with some embodiments of the present disclosure.

In S240b, as shown in FIG. 21A, the second electrode layer 4 is formed on a surface of the diaphragm film 31 away from the substrate 1.

For example, a method of forming the second electrode layer 4 in S240b may be the same as the method of forming the second electrode layer 4 in S260a, which will not be repeated here.

Figure 21B:
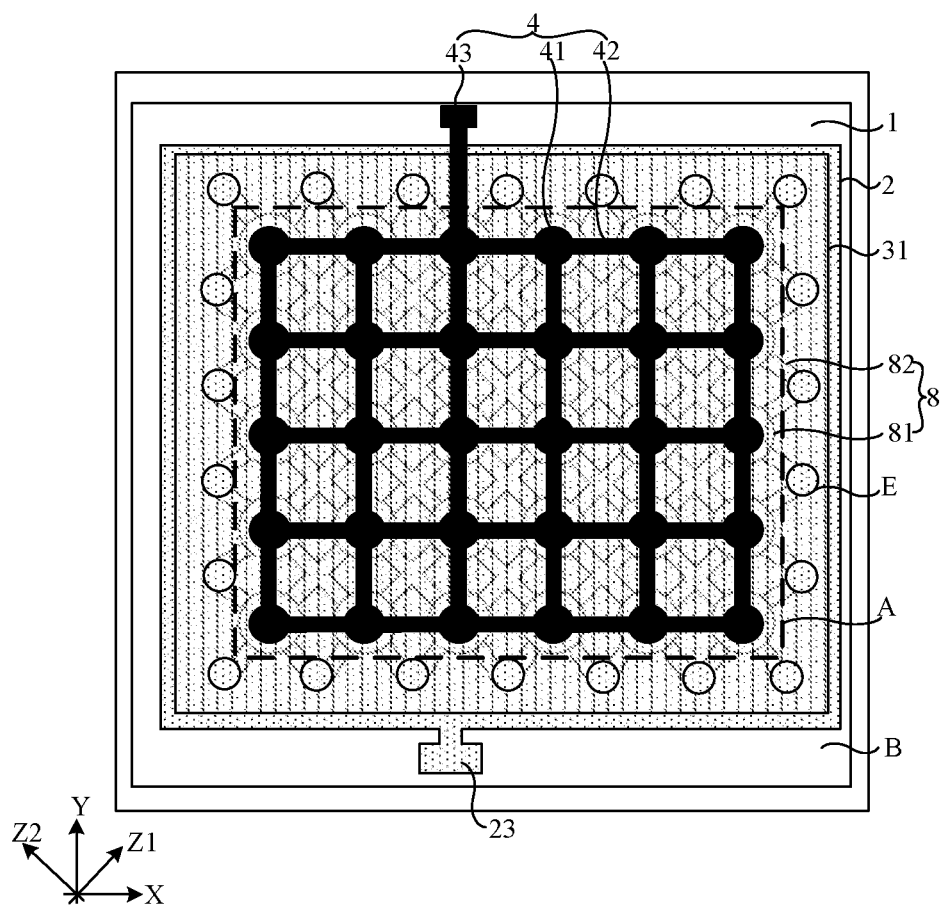

In S250b, as shown in FIG. 21B, the diaphragm film 31 is patterned to form a plurality of release holes E, so as to obtain the diaphragm layer 3. The plurality of release holes E expose portions of the sacrificial layer 8.

Here, after the diaphragm layer 3 is formed, the plurality of release holes E in the diaphragm layer 3 are located in the peripheral region B of the array element 10.

It can be understood that in a case where other layers are formed on portions of the diaphragm film 31 where the release holes E are to be formed, the other layers on the portions where the release holes E are to be formed should be removed first, and then the diaphragm film 31 is patterned.

For example, a method of forming the diaphragm layer 3 in S250b may be the same as the method of forming the diaphragm layer 3 in S240a, which will not be repeated here.

Figure 21C:
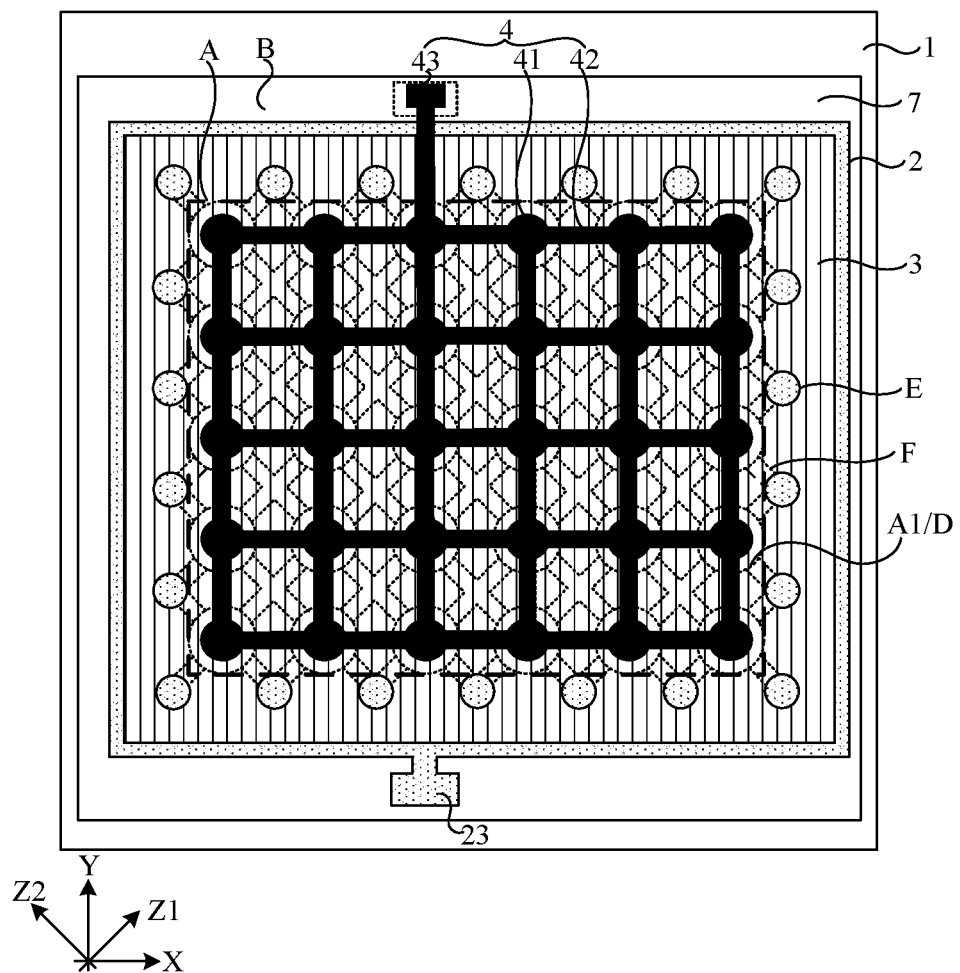

In S260b, as shown in FIG. 21C, the plurality of sacrificial patterns 81 in the sacrificial layer 8 are removed through the plurality of release holes E to form the plurality of cavities D, and the plurality of sacrificial channels 82 in the sacrificial layer 8 are removed to form a plurality of connection channels F. Two adjacent cavities D communicate with each other through a connection channel F, and the release hole E communicates with at least one cavity D adjacent thereto through connection channel(s) F.

For example, a method of forming the cavities D in S260b and may be the same as the method of forming the cavities D in S250a, and a method of forming the connection channels F in S260b may be the same as the method of forming the connection channels F in S250a, which will not be repeated here.

In some embodiments, the manufacturing method of the transducer component further includes steps 261b and 262b (S261b and S262b) after S260b.

In S261b, as shown in FIG. 20K, a filling film 62 is formed on the surface of the diaphragm layer 3 away from the substrate 1, and portions of the filling film are located in the plurality of release holes E.

For example, a method of forming the filling film in S261b may be the same as the method of forming the filling film in S251a, which will not be repeated here.

In S262b, as shown in FIG. 20H, the filling film is patterned to form the plurality of filling patterns 61, so as to obtain the filling layer 6. At least a portion of a filling pattern 61 is located in a release hole E, and an orthogonal projection of the release hole E on the substrate 1 coincides with an orthogonal projection of the filling pattern 61 on the substrate 1, or the orthogonal projection of the release hole E on the substrate 1 is located within the orthogonal projection of the filling pattern 61 on the substrate 1.

For example, a method of forming the filling layer 6 in S262b may be the same as the method of forming the filling layer 6 in S252a, which will not be repeated here.

Figure 24:
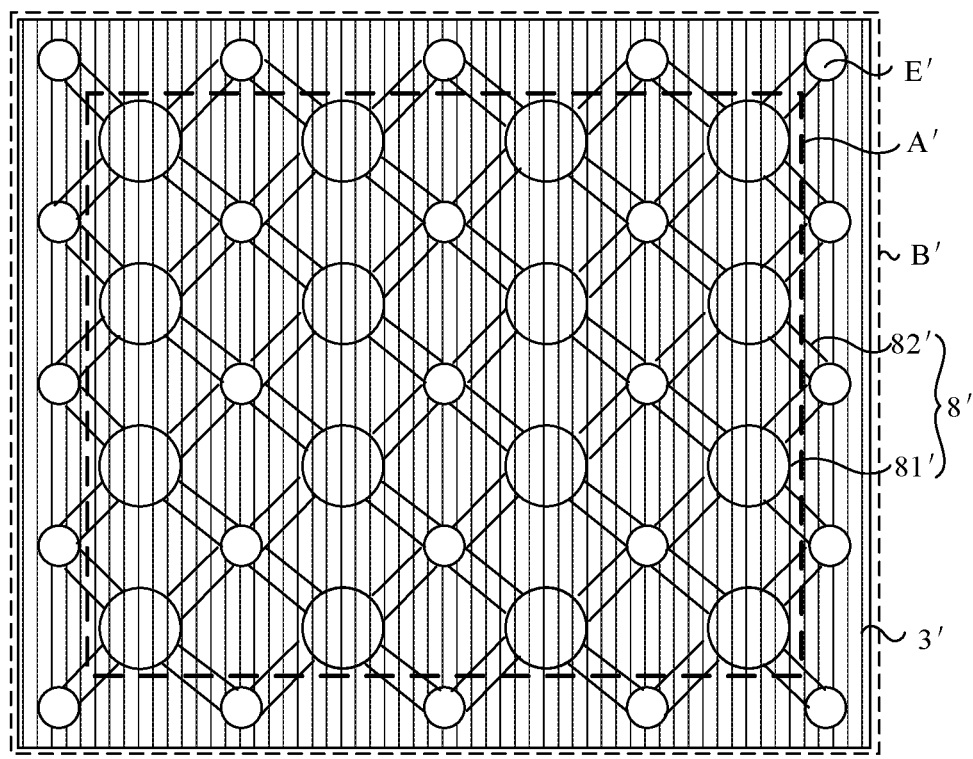
FIG. 24 is a diagram illustrating a structure of a sacrificial layer and a diaphragm layer, in accordance with an implementation manner.

In an implementation manner, in a process of manufacturing a transducer component, structures of a sacrificial layer 8' and a diaphragm layer 3' are as shown in FIG. 24, each sacrificial pattern 81' is connected to sacrificial channels 82', release holes E' in the diaphragm layer 3' are located in a periphery of each working sub-region A1', and each release hole E' exposes a portion of the sacrificial channel 82'. The sacrificial patterns 81' and the sacrificial channels 82' may be removed through a plurality of release holes E' in the diaphragm layer 3'. Since the release holes E' are located in the periphery of each working sub-region A1', the number of working sub-regions A1' is reduced, and transmitting and receiving sensitivities of the transducer component is low, which leads to a low detection sensitivity of a transducer in this implementation manner.

However, in a process of manufacturing the transducer component 100 in the embodiments of the present disclosure, the sacrificial pattern 81 and the sacrificial channel 82 are connected to each other, the plurality of release holes E are formed only in the peripheral region B, and the sacrificial patterns 81 and the sacrificial channels 82 that are connected as a whole may be removed through the plurality of release holes E. In addition, since the plurality of release holes E are formed only in the peripheral region B, the number of working sub-regions A1 may be increased, so that transmitting and receiving sensitivities of the array element 10 in the transducer component 100 are improved. As a result, detection sensitivities of the transducer component 100 and the transducer 1000 to which the transducer component 100 is applied are improved.

In some embodiments, as shown in FIG. 20C, each sacrificial pattern 81 and at least two sacrificial patterns 81 surrounding the sacrificial pattern 81 are connected together through sacrificial channels 82. In some other embodiments, each sacrificial pattern 81 and one sacrificial pattern 81 surrounding the sacrificial pattern 81 are connected together through a sacrificial channel 82.

Here, each sacrificial pattern 81 and at least two sacrificial patterns 81 surrounding the sacrificial pattern 81 connected together through the sacrificial channels 82 means that each sacrificial pattern 81 is connected to two or more sacrificial patterns 81 surrounding the sacrificial pattern 81 through sacrificial channels 82.

In the embodiments of the present disclosure, since each sacrificial pattern 81 is connected to the at least two sacrificial patterns 81 surrounding the sacrificial pattern 81 through the sacrificial channels 82, the sacrificial layer 8 may be quickly removed, and a removal speed and a removal effect of the sacrificial layer 8 may be effectively ensured.

In some embodiments, as shown in FIG. 20H, orthogonal projection(s), on the substrate 1, of at least one of the first electrode layer 2 and the second electrode layer 4 does not overlap with orthogonal projections of the plurality of sacrificial channels 82 on the substrate 1.

For example, referring to FIG. 11, the first electrode layer 2 includes a plurality of first electrodes 21 and a plurality of first connection electrodes 22; and/or, referring to FIG. 2, the second electrode layer 4 includes a plurality of second electrodes 41 and a plurality of second connection electrodes 42. For the positional relationship and connection manner of the first electrodes 21 and the first connection electrodes 22 in the first electrode layer 2, and the positional relationship and connection manner of the second electrodes 41 and the second connection electrodes 42 in the second electrode layer 4, reference can be made to the descriptions in the embodiments/examples, and details will not be repeated here.

Here, an orthogonal projection of the second electrode layer 4 on the substrate 1 not overlapping with the orthogonal projections of the plurality of sacrificial channels 82 on the substrate 1 is taken as an example.

As shown in FIG. 20H, the plurality of sacrificial patterns 81 in the sacrificial layer 8 are located in the plurality of working sub-regions A1, and a second electrode 41 is located in a working sub-region A1, so that an arrangement of the sacrificial patterns 81 is the same as an arrangement of the second electrodes 41.

In a case where the sacrificial patterns 81 and the second electrodes 41 are all arranged in an array, as shown in FIG. 20H, the orthogonal projection of the second electrode layer 4 on the substrate 1 does not overlap with the orthogonal projections of the sacrificial channels 82 on the substrate 1. Since the connection channels F are formed between portions of the diaphragm layer 3 corresponding to the sacrificial channels 82 and the first electrode layer 2 after the sacrificial channels 82 are removed, as shown in FIG. 20H, positions of the connection channels F are positions of the sacrificial channels 82.

In a process of designing the second electrode layer 4 and the sacrificial layer 8, for example, as shown in FIG. 20H, in the first direction X, second electrodes 41 in each row are connected together through connection electrodes 42; and in the second direction Y, second electrodes 41 in each column are connected together through connection electrodes 42. Based on this, as shown in FIG. 20C, the third direction Z1, sacrificial patterns 81 are connected together through sacrificial channels 82; and in the fourth direction Z2, sacrificial patterns 81 are connected together through sacrificial channels 82.

Based on the above, it can be seen that positions of the diaphragm layer 3 corresponding to the sacrificial channels 82 correspond to the connection channels F between the diaphragm layer 3 and the first electrode layer 2. If the sacrificial channels 82 overlap with both the first electrode layer 2 and the second electrode layer 4, in a process of applying voltages to the first electrode layer 2 and the second electrode layer 4, in addition to portions of the diaphragm layer 3 located in the working sub-regions A1 vibrating in the direction perpendicular to the substrate 1 between the first electrode layer 2 and the second electrode layer 4, the portions of the diaphragm layer 3 corresponding to the sacrificial channels 82 may also vibrate in the direction perpendicular to the substrate 1 between the first electrode layer 2 and the second electrode layer 4. A vibration frequency of the portions of the diaphragm layer 3 corresponding to the sacrificial channels 82 is different from a vibration frequency of the portions of the diaphragm layer 3 located in the working sub-regions A1, which may affects transmitting and receiving accuracies of the array element 10, and further affects a detection accuracy of the transducer component 100.

In the embodiments of the present disclosure, since an orthogonal projection of the first electrode layer 2 and/or the orthogonal projection of the second electrode layer 4 on the substrate 1 do not overlap with the orthogonal projections of the sacrificial channels 82 on the substrate 1, the portions of the diaphragm layer 3 corresponding to the sacrificial channels 82 may not vibrate between the first electrode layer 2 and the second electrode layer 4, thereby avoiding an influence on the portions of the diaphragm layer 3 located in the working sub-regions A1.

Since one first electrode 21 in the plurality of first electrodes 21 included in the first electrode layer 2 corresponds to one working sub-region A1, and/or, one second electrode 41 in the plurality of second electrodes 41 included in the second electrode layer 4 corresponds to one working sub-region A1, it may be ensured that only the portions of the diaphragm layer 3 located in the working sub-regions A1 vibrate in the direction perpendicular to the substrate 1 between the first electrode layer 2 and the second electrode layer 4.

In some embodiments, after S210a and before S220a, or after S210b and before S220b, as shown in FIG. 20B, the manufacturing method of the transducer component further includes: forming an etch stop layer 5 on the surface of the first electrode layer 2 away from the substrate 1.

Here, a material and a structure of the etch stop layer 5 are not limited, reference may be made to the above embodiments, and details will not be repeated here.

In the embodiments of the present disclosure, since the etch stop layer 5 is formed between the first electrode layer 2 and the diaphragm layer 3, the etch stop layer 5 may be used to block the etching gas or the etching solution in processes of etching the diaphragm layer 3 to form the release holes E and removing the sacrificial layer 8, which prevents the etching gas or the etching solution from damaging the first electrode layer 2. In addition, the material of the diaphragm layer 3 and the material of the etch stop layer 5 may cooperate with each other, so as to ensure that the first electrode layer 2 and the second electrode layer 4 are insulated from each other, and increase a material selectivity of the diaphragm layer 3. For example, in a case where the material of the diaphragm layer 3 is a conductive material, the material of the etch stop layer 5 is an insulating material.

Figure 19:
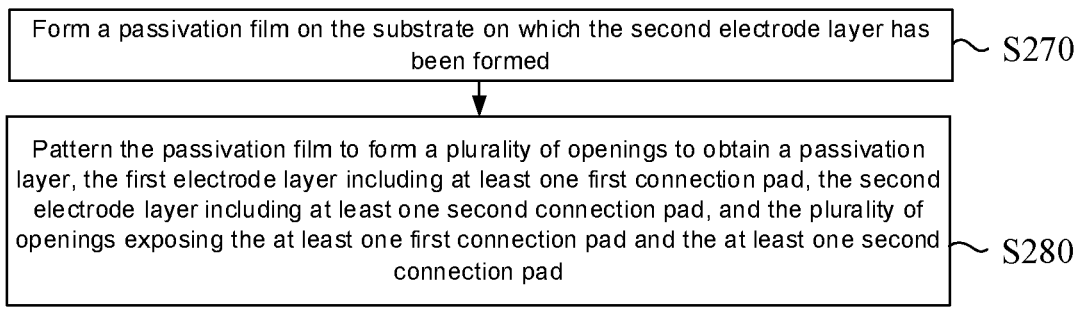
FIG. 19 is a flow diagram illustrating a method of forming a passivation layer, in accordance with some embodiments of the present disclosure.

In some embodiments, as shown in FIG. 19, after S260a or S240b, the manufacturing method of the transducer component further includes steps 270 and 280 (S270 and S280).

Figure 20L:
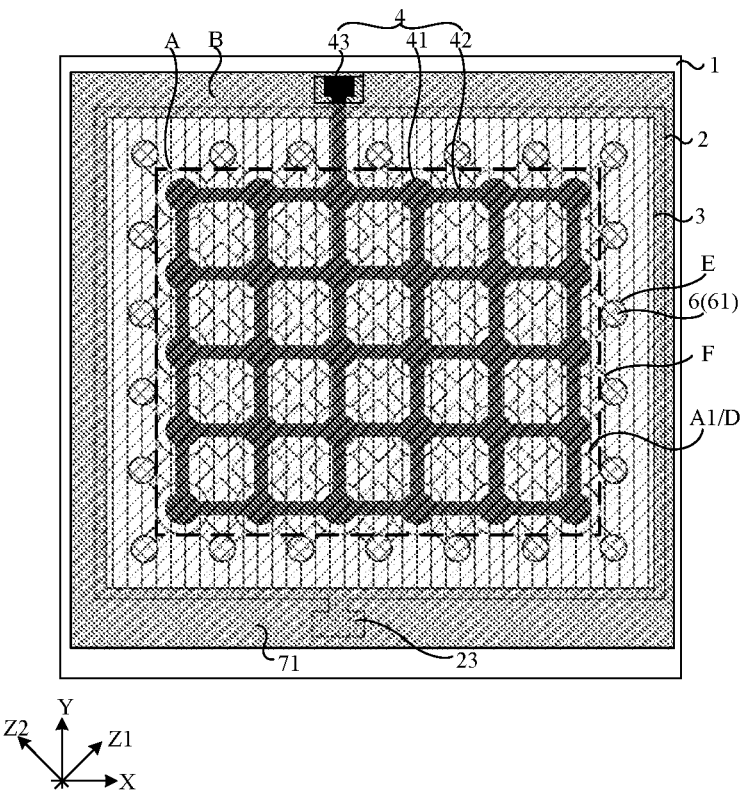

In S270, as shown in FIG. 20L, a passivation film 71 is formed on the substrate 1 on which the second electrode layer 4 has been formed.

For example, the passivation film 71 may be formed by using a deposition process.

In S280, as shown in FIG. 20I, the passivation film 71 is patterned to form a plurality of openings G, so as to obtain a passivation layer 7. The first electrode layer 2 includes at least one first connection pad 23, and the second electrode layer 4 includes at least one second connection pad 43. The plurality of openings G in the passivation layer 7 expose the at least one first connection pad 23 and the at least one second connection pad 43. The orthogonal projection of the diaphragm layer 3 on the substrate 1 does not overlap with orthogonal projection(s) of the at least one first connection pad 23 on the substrate 1.

In addition, a process of removing portion(s) of a layer (e.g., the passivation film) on surface(s) of the first connection pad(s) 23 away from the substrate 1 and surface(s) of the second connection pad(s) 43 away from the substrate 1 to expose the first connection pad(s) 23 and the second connection pad(s) 43 may be referred to as a process of forming the openings G of the passivation layer 7.

It can be understood that, in a case where other layers (e.g., the etch stop layer 5 and/or the diaphragm layer 3) other than the passivation layer 7 are formed on the first connection pad(s) 23, after the passivation layer 7 is formed, portion(s) of the etch stop layer 5 on the surface(s) of the first connection pad(s) 23 away from the substrate 1 and/or portion(s) of the diaphragm layer 3 on the surface(s) of the first connection pad(s) 23 away from the substrate 1 should be removed, so as to expose the first connection pad(s) 23, and avoid the orthogonal projection of the etch stop layer 5 on the substrate 1 and/or the orthogonal projection of the diaphragm layer 3 on the substrate 1 overlapping with the orthogonal projection(s) of the at least one first connection pad 23 on the substrate 1.

As shown in FIGS. 20B, 20I and 20J, in an example in which the etch stop layer 5 is formed on the first connection pad(s) 23, after the passivation layer 7 with the plurality of openings G are formed, the etch stop layer 5 may be patterned, so as to remove the portion(s) of the etch stop layer 5 located on the surface(s) of the first connection pad(s) 23 away from the substrate 1, and thus exposing the first connection pad(s) 23.

In the embodiments of the present disclosure, by forming the passivation layer 7 on the surface of the second electrode layer 4 away from the substrate 1, it is possible to use the passivation layer 7 to protect the transducer component 100, and avoid a case where the first electrode layer 2, the etch stop layer 5, the diaphragm layer 3, the second electrode layer 4, and wirings (e.g., signal lines electrically connected to the first connection pad(s) 23 and the second connection pad(s) 43) that are located between the passivation layer 7 and the substrate 1 are damaged, which affects a normal detection of the transducer component 100 or the transducer 1000. In this case, the transducer 1000 may be an ultrasonic sensor.

Based on this, the passivation layer 7 has the plurality of openings G, the plurality of openings G may expose the first connection pad(s) 23 and the second connection pad(s) 43, which may facilitate the first connection pad(s) 23 being electrical connected to corresponding signal line(s), so as to supply a voltage to the first electrode layer 2, and facilitate the second connection pad(s) 43 being electrical connected to corresponding signal line(s), so as to supply a voltage to the second electrode layer 4.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A transducer component, comprising a plurality of array elements, wherein
at least one array element of the plurality of array elements includes:
a substrate; and
a first electrode layer, a diaphragm layer, and a second electrode layer that are sequentially stacked on the substrate, the first electrode layer and the second electrode layer being insulated from each other, wherein
an array element has a working region and a peripheral region surrounding the working region, and the working region includes a plurality of working sub-regions; overlapping portions of the first electrode layer, the diaphragm layer and the second electrode layer form a plurality of cells located in the working region, and a cell is located in a working sub-region;

portions of the diaphragm layer located in the plurality of working sub-regions and portions of the first electrode layer located in the plurality of working sub-regions have a plurality of cavities therebetween, and the portions of the diaphragm layer located in the plurality of working sub-regions are configured to vibrate in a direction perpendicular to the substrate between the first electrode layer and the second electrode layer to perform signal conversion; two adjacent cavities communicate with each other;

the diaphragm layer has a plurality of release holes, the plurality of release holes are located in the peripheral region; and a release hole communicates with at least one cavity;

wherein the array element further includes a plurality of connection channels disposed on sides, proximate to the first electrode layer, of portions of the diaphragm layer that are located in regions outside the plurality of working sub-regions;

the two adjacent cavities communicate with each other through a connection channel; and the release hole communicates with at least one cavity adjacent thereto through at least one connection channel.

2. The transducer component according to claim 1, wherein the plurality of cavities are arranged in rows in a first direction and in columns in a second direction, and the first direction intersects with the second direction;

in the first direction, any two adjacent cavities communicate through a connection channel; and in the second direction, any two adjacent cavities communicate through a connection channel; and/or in a third direction, any two adjacent cavities communicate through a connection channel; in a fourth direction, any two adjacent cavities communicate through a connection channel; and the third direction is a direction of an angle bisector between the first direction and the second direction, and the fourth direction is perpendicular to the third direction.

3. The transducer component according to claim 2, wherein a direction in which a connection channel connected to the release hole and a cavity extends has an included angle with the first direction; and/or, a direction in which a connection channel connected to the release hole and a cavity extends has an included angle with the second direction.

4. The transducer component according to claim 2, wherein the release hole communicates with a cavity through a connection channel in the third direction or the fourth direction.

5. The transducer component according to claim 1, wherein orthogonal projections of the connection channels on the substrate do not overlap with at least one of orthogonal projections of the first electrode layer and the second electrode layer on the substrate.

6. The transducer component according to claim 1, wherein the first electrode layer includes a plurality of first electrodes and a plurality of first connection electrodes; a first connection electrode connects two adjacent first electrodes, and the first electrode is located in a working sub-region; and orthogonal projections of the plurality of first connection electrodes on the substrate do not overlap with orthogonal projections of the plurality of connection channels on the substrate; and/or the second electrode layer includes a plurality of second electrodes and a plurality of second connection electrodes; a second connection electrode connects two adjacent second electrodes, and the second electrode is located in a working sub-region; and orthogonal projections of the plurality of second connection electrodes on the substrate do not overlap with the orthogonal projections of the plurality of connection channels on the substrate.

7. The transducer component according to claim 1, wherein the array element further includes a filling layer disposed on a side of the diaphragm layer away from the substrate, and the filling layer includes a plurality of filling patterns;

at least a portion of a filling pattern is located in the release hole; and an orthogonal projection of the release hole on the substrate coincides with an orthogonal projection of the filling pattern on the substrate, or an orthogonal projection of the release hole on the substrate is located within an orthogonal projection of the filling pattern on the substrate.

8. The transducer component according to claim 1, wherein the array element further includes an etch stop layer disposed between the first electrode layer and the diaphragm layer;

orthogonal projections of the plurality of cavities on the substrate and orthogonal projections of the plurality of release holes on the substrate are located within an orthogonal projection of the etch stop layer on the substrate; and at least one of the etch stop layer and the diaphragm layer is made of an insulating material.

9. The transducer component according to claim 8, wherein the array element further includes a passivation layer disposed on a side of the second electrode layer away from the substrate, and the passivation layer has a plurality of openings;

the first electrode layer includes at least one first connection pad, and the second electrode layer includes at least one second connection pad;

the plurality of openings expose the at least one first connection pad and the at least one second connection pad;

an orthogonal projection of the diaphragm layer on the substrate does not overlap with at least one orthogonal projection of the at least one first connection pad on the substrate; and an orthogonal projection of the etch stop layer on the substrate does not overlap with the at least one orthogonal projection of the at least one first connection pad on the substrate.

10. The transducer component according to claim 1, wherein the array element further includes a passivation layer disposed on a side of the second electrode layer away from the substrate, and the passivation layer has a plurality of openings;

the first electrode layer includes at least one first connection pad, and the second electrode layer includes at least one second connection pad;

the plurality of openings expose the at least one first connection pad and the at least one second connection pad;

an orthogonal projection of the diaphragm layer on the substrate does not overlap with at least one orthogonal projection of the at least one first connection pad on the substrate.

11. A transducer, comprising the transducer component according to claim 1.

12. A manufacturing method of a transducer component, comprising forming a plurality of array elements, wherein
forming an array element of the plurality of array elements includes:
providing a substrate; and
forming a first electrode layer, a diaphragm layer, and a second electrode layer that are sequentially stacked on the substrate, the first electrode layer and the second electrode layer being insulated from each other, wherein
the array element has a working region and a peripheral region surrounding the working region, and the working region includes a plurality of working sub-regions; overlapping portions of the first electrode layer, the diaphragm layer, and the second electrode layer form a plurality of cells located in the working region, and a cell is located in a working sub-region; portions of the diaphragm layer located in the plurality of working sub-regions and portions of the first electrode layer located in the plurality of working sub-regions have a plurality of cavities therebetween, and the portions of the diaphragm layer located in the plurality of working sub-regions are configured to vibrate in a direction perpendicular to the substrate between the first electrode layer and the second electrode layer to perform signal conversion; two adjacent cavities communicate with each other; and the diaphragm layer has a plurality of release holes, the plurality of release holes are located in the peripheral region, and a release hole communicates with at least one cavity;
the array element further includes a plurality of connection channels disposed on sides, proximate to the first electrode layer, of portions of the diaphragm layer that are located in regions outside the plurality of working sub-regions; and
forming the first electrode layer, the diaphragm layer, and the second electrode layer that are sequentially stacked on the substrate, and forming the plurality of cavities and the plurality of connection channels, includes:
forming the first electrode layer on the substrate;
forming a sacrificial layer on a surface of the first electrode layer away from the substrate, the sacrificial layer including a plurality of sacrificial patterns and a plurality of sacrificial channels, two adjacent sacrificial patterns being connected through a sacrificial channel, and the plurality of sacrificial patterns being located in the plurality of working sub-regions;
forming a diaphragm film on a surface of the sacrificial layer away from the substrate;
patterning the diaphragm film to form the plurality of release holes, so as to obtain the diaphragm layer, the plurality of release holes exposing portions of the sacrificial layer;
removing the plurality of sacrificial patterns in the sacrificial layer through the plurality of release holes to form the plurality of cavities, and removing the plurality of sacrificial channels in the sacrificial layer to form the plurality of connection channels, two adjacent cavities communicating with each other through a connection channel, and the release hole communicating with at least one cavity adjacent thereto through at least one connection channel; and
forming the second electrode layer on a surface of the diaphragm layer away from the substrate.

13. The manufacturing method of the transducer component according to claim 12, wherein before the second electrode layer is formed, the manufacturing method of the transducer component further comprises:
forming a filling film on the surface of the diaphragm layer away from the substrate, portions of the filling film being located in the plurality of release holes; and
patterning the filling film to form a plurality of filling patterns, so as to obtain a filling layer, wherein at least a portion of a filling pattern is located in a release hole; and an orthogonal projection of the release hole on the substrate coincides with an orthogonal projection of the filling pattern on the substrate, or an orthogonal projection of the release hole on the substrate is located within an orthogonal projection of the filling pattern on the substrate.

14. The manufacturing method of the transducer component according to claim 12, wherein the array element further includes a plurality of connection channels disposed on sides, proximate to the first electrode layer, of portions of the diaphragm layer that are located in regions outside the plurality of working sub-regions; and forming the first electrode layer, the diaphragm layer, and the second electrode layer that are sequentially stacked on the substrate, and forming the plurality of cavities and the plurality of connection channels, includes:
forming the first electrode layer on the substrate;
forming a sacrificial layer on a surface of the first electrode layer away from the substrate, the sacrificial layer including a plurality of sacrificial patterns and a plurality of sacrificial channels, two adjacent sacrificial patterns being connected through a sacrificial channel, and the plurality of sacrificial patterns being located in the plurality of working sub-regions;
forming a diaphragm film on a surface of the sacrificial layer away from the substrate;
forming the second electrode layer on the surface of the diaphragm film away from the substrate;
patterning the diaphragm film to form the plurality of release holes, so as to obtain the diaphragm layer, the plurality of release holes exposing portions of the sacrificial layer; and
removing the plurality of sacrificial patterns in the sacrificial layer through the plurality of release holes to form the plurality of cavities, and removing the plurality of sacrificial channels in the sacrificial layer to form the plurality of connection channels, two adjacent cavities communicating with each other through a connection channel, and the release hole communicating with at least one cavity adjacent thereto through at least one connection channel.

15. The manufacturing method of the transducer component according to claim 14, wherein after the plurality of cavities and the plurality of connection channels are formed, the manufacturing method of the transducer component further comprises:
forming a filling film on a surface of the diaphragm layer away from the substrate, portions of the filling film being located in the plurality of release holes; and
patterning the filling film to form a plurality of filling patterns, so as to obtain a filling layer, wherein at least a portion of a filling pattern is located in a release hole; and an orthogonal projection of the release hole on the substrate coincides with an orthogonal projection of the filling pattern on the substrate; or an orthogonal projection of the release hole on the substrate is located within an orthogonal projection of the filling pattern on the substrate.

16. The manufacturing method of the transducer component according to claim 12, wherein at least one of orthogonal projections of the first electrode layer and the second electrode layer on the substrate does not overlap with orthogonal projections of the plurality of sacrificial channels on the substrate.

17. The manufacturing method of the transducer component according to claim 12, further comprising:
   forming a passivation film on the substrate on which the second electrode layer has been formed; and
   patterning the passivation film to form a plurality of openings, so as to obtain a passivation layer, wherein the first electrode layer includes at least one first connection pad, the second electrode layer includes at least one second connection pad, and the plurality of openings expose the at least one first connection pad and the at least one second connection pad; and an orthogonal projection of the diaphragm layer on the substrate does not overlap with at least one orthogonal projection of the at least one first connection pad on the substrate.

* * * * *